(12) United States Patent
Okada

(10) Patent No.: US 7,859,544 B2
(45) Date of Patent: Dec. 28, 2010

(54) DATA FEDERATION SYSTEM, AND CONTROL METHOD AND CONTROL PROGRAM THEREOF

(75) Inventor: Yuuki Okada, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1052 days.

(21) Appl. No.: 11/560,075

(22) Filed: Nov. 15, 2006

(65) Prior Publication Data

US 2008/0036781 A1 Feb. 14, 2008

(30) Foreign Application Priority Data

Aug. 11, 2006 (JP) ............................. 2006-219244

(51) Int. Cl.
*G09G 5/00* (2006.01)

(52) U.S. Cl. ...................... 345/581; 345/420; 345/630; 707/971; 700/98

(58) Field of Classification Search ................ 707/201, 707/4; 345/581; 700/100; 716/11
See application file for complete search history.

(56) References Cited

U.S. PATENT DOCUMENTS

| | | | |
|---|---|---|---|
| 5,300,943 | A | 4/1994 | Jakobs et al. |
| 6,618,026 | B1 | 9/2003 | Grigor et al. |
| 2003/0052835 | A1 | 3/2003 | Krempl |
| 2003/0212714 | A1* | 11/2003 | Larsen ........................ 707/201 |
| 2004/0054675 | A1* | 3/2004 | Li ................................ 707/100 |
| 2005/0138081 | A1* | 6/2005 | Alshab et al. ................ 707/200 |
| 2005/0155008 | A1* | 7/2005 | Archambeault et al. ........ 716/11 |
| 2006/0047353 | A1* | 3/2006 | Maenishi et al. ............. 700/100 |
| 2006/0235838 | A1* | 10/2006 | Shan et al. ...................... 707/4 |
| 2007/0013709 | A1* | 1/2007 | Charles et al. ............... 345/581 |
| 2007/0027715 | A1* | 2/2007 | Gropper et al. ................ 705/2 |
| 2008/0007568 | A1* | 1/2008 | Chou et al. .................. 345/629 |

FOREIGN PATENT DOCUMENTS

| | | |
|---|---|---|
| EP | 0 262 991 A2 | 4/1988 |
| JP | 2004-086782 | 3/2004 |
| JP | 2004-192091 | 7/2004 |

* cited by examiner

*Primary Examiner*—Xiao M Wu
*Assistant Examiner*—Phi Hoang
(74) *Attorney, Agent, or Firm*—Foley & Lardner LLP

(57) ABSTRACT

The present invention allows highly efficient high-speed data processing based on dynamic data federation among a plurality of data display means, without increasing the data volume in the individual data display means. A user data display section has a classification and component specific information table, which is extracted from a three-dimensional component database and a two-dimensional component database, and a component attribute data table associated thereto. A federation control section controls data federation among a three-dimensional component data display section, two-dimensional component data display section and user data display section. A jump section acquires the classification or component specific information using the classification and component specific information table, retrieves the three-dimensional component database or two-dimensional component database by controlling the three-dimensional component data display section or two-dimensional component data display section, and displays an image display screen of the three-dimensional component data or two-dimensional component data of the retrieved component.

19 Claims, 16 Drawing Sheets

FIG. 12
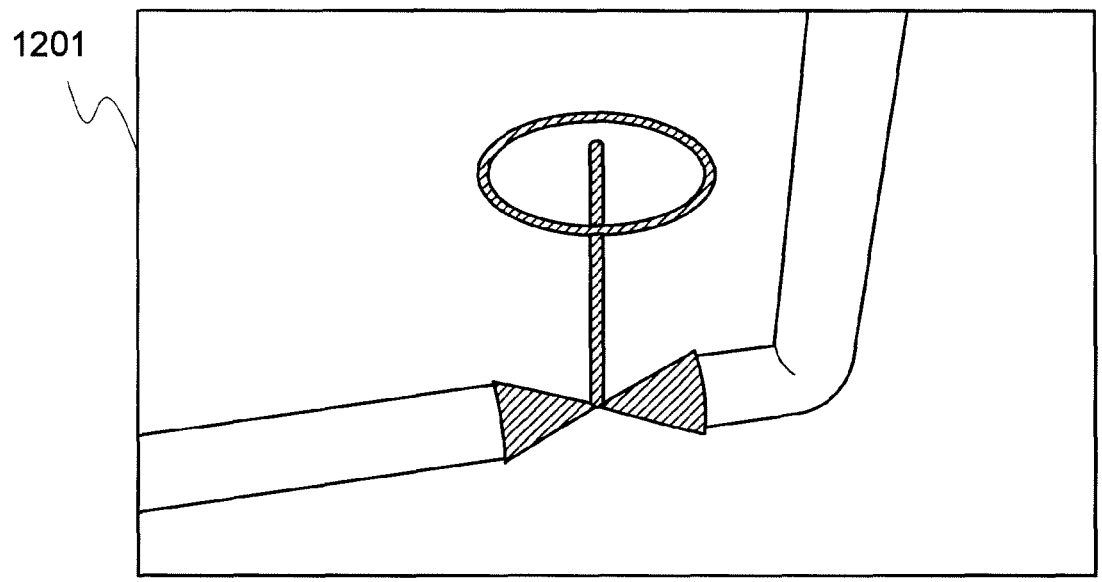
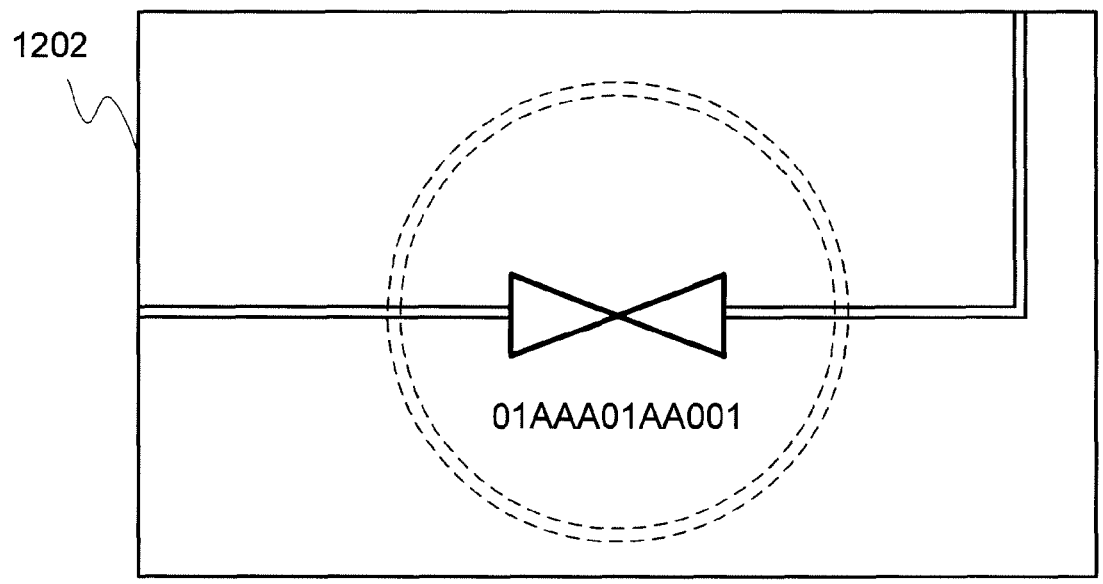

| | A | B | C | D | E | F |
|---|---|---|---|---|---|---|
| 1 | Spools List | | | | | |
| 2 | | | | | | |
| 3 | Spool ID | Weight(kg) | Surface Area(m2) | | | |
| 4 | C00-11-1 | 1034.7 | 4.328 | | | |
| 5 | C00-11-2 | 1438.4 | 6.016 | | | |
| 6 | C00-11-4 | 3052 | 12.766 | | | |
| 7 | C00-11-5 | 1123.5 | 4.728 | | | |
| 8 | | | | | | |
| 9 | | | | | | |
| 10 | | | | | | |

\Spools / Valves and Specialities / Instru
command

1402

Please select book number:

(Piping Drawing) DOC00001 ▼

Display file format:  ⦿ Image file (PDF)
                     ○ Electronic file (PDF)

OK    Cancel

FIG. 16

- ☑ No date specified (Initial) — ☑ Blue ▶
- ☑ Date of shipment — ☑ Sky blue ▶
- ☑ Date of FOB — ☑ Green ▶
- ☐ ETA on the port — ☑ Blue ▶
- ☑ ATA on the port — ☑ Yellow ▶
- ☐ Estimated time of C.C. — ☑ Blue ▶
- ☑ Actual time of C.C. — ☑ Orange ▶
- ☐ Estimated time of arrival — ☑ Blue ▶
- ☑ Actual time of arrival — ☑ Peach ▶
- ☑ Date of using each product — ☑ Red ▶

Color in state of this day — 2006/6/21 ...

Jump by specifying name ▶

Color on 3D review

Read latest data

Cancel color arrange

Color range
- ◉ Only selected
- ○ All

Change | Attribute | Setting | End

- 1607
- 1606
- 1604
- 1605
- 1603
- 1600 CONTROL SCREEN FOR COMPONENT COLOR ARRANGEMENT PROCESSING ON COMPONENT DELIVERY TIME

DATA FEDERATION SYSTEM, AND CONTROL METHOD AND CONTROL PROGRAM THEREOF

BACKGROUND OF THE INVENTION

1. Field of the Invention

The present invention relates to a technology to implement data federation among a plurality of data display means each of which has a mutually independent database, using computers.

2. Description of the Related Art

As software to represent data on a computer, Internet home pages and spreadsheets, for example, which are generally called "data display tools", are generally used. Particularly as data display tools for image data processing in the computer design field, two-dimensional CAD, three-dimensional CAD and three-dimensional review software, for example, are used.

These data display tools have been mainly used for a single purpose, and tools have been updated by adding functions according to purpose, where data federation connecting the functions of a plurality of tools was unnecessary.

The data access relationship among a plurality of data display tools was basically converting the data of a tool with another tool and loading the data, otherwise data display tools upstream and data display tools downstream were not associated, and the data was independently processed and completed. In other words, even if a data acquired as a processing result of a certain tool might be loaded to another tool as additional data, but data federation among a plurality of tools was hardly required.

In Internet home pages and spreadsheets, for example, subsequent actions might be embedded in the self data so as to link data when the program is started, but data flow was not controlled between an upstream tool and downstream tool.

On the other hand, a two-dimensional CAD, three-dimensional CAD and three-dimensional review tool are engineering tools, so each tool is generally handled independently, and when an individual operation is over, the data, as a result of the operation, might be used by another tool, but data federation with another tool was not performed.

In the engineering tool field, a device of loading the data of a certain tool using another tool, by conversion processing, using data conversion and inverse data conversion via an integrated database, has been proposed as a technology to use data among a plurality of data display tools (e.g. Japanese Patent Application Laid-Open No. 2004-192091). Also a device to create mapping data by comparing and collating databases of a plurality of data display tools and manage the data consistently among the tools has also been proposed (e.g. Japanese Patent Application Laid-open NO. 2004-86782).

The above conventional technology on data use among data display tools, however, is not for data federation among a plurality of tools, and particularly in the case of engineering tools, such as a two-dimensional CAD, three-dimensional CAD and three-dimensional review tool, conventional technology merely has a data access relationship to the load data of a tool by converting the data using another tool, and a technology to dynamically link data among tools has not yet been established.

In recent computer design, however, a dynamic data federation among tools is becoming a requirement. This aspect will now be described.

For the design of a plant, such as a power plant, for example, three-dimensional review tools which allow representation as if a human is walking through a virtual space created by a three-dimensional CG ("walk through") is often used. Since a three-dimensional review tool is convenient to confirm passages, confirm accessibility to equipment and valves, and check the visual interface in power plant design, it is becoming a standard tool when a power plant is planned. Recently this tool has begun to be used not only for designing power plants but also for confirmation in a construction site. But to use this tool in a busy construction site, there are the following two major problems.

One problem is that reaching a target component is difficult. In a construction site, it takes a long time to collate components on the system diagram/system piping diagram and actual components. Confirmation is possible by a three-dimensional review tool, but it still involves enormous work to reach a component merely by a walk through if the data on the entire plant becomes enormous. Therefore it is demanded to reach a target component on a three-dimensional model easily, even by instrumentation and trial run engineers who were not involved in the planning of the plant.

Another problem is that a three-dimensional review tool is simply a review tool. Even if a target component is reached, information that can be acquired is merely information on a peripheral area of a component after construction. Once a condition is known by a three-dimensional image, one may also desire to check the component specifications and related drawings, but such information is managed by a data display tool, which is separate from a three-dimensional review tool, and cannot be checked by the three-dimensional review tool. Therefore it is demanded to easily confirm the data associating various information related to a three-dimensional image.

It is possible to convert and load the related information managed by another data display tool by a three-dimensional review tool applying the above mentioned prior art to meet the above demand, but in this case the data volume to be handled by the three-dimensional review tool increases. In other words, managing various related information in the three-dimensional review tool which manages an enormous volume of three-dimensional image data further increases the data volume to be handled dramatically, and as a result, a new problem emerges, such as a drop in processing efficiency.

The above problem is not limited to power plant design using three-dimensional image data, but exists in the same way for cases when enormous data, such as three-dimensional image data and two-dimensional drawing data, is handled using various data display tools. To solve this problem, a technology to perform dynamic data federation among the data display tools in software units, or dynamic data federation among data display devices or data display systems in hardware units is required, but such a technology has not yet been established.

With a solution to the above problems of prior art in view, it is an object of the present invention to provide a data federation system for performing highly efficient high-speed data processing by dynamic data federation among a plurality of data display means which have mutually independent databases respectively, without increasing the data volume of an individual data display means, and control method and control program thereof.

SUMMARY OF THE INVENTION

To achieve the above object, the present invention acquires classification or component specific information to indicate a specific component from a user using a user data display means for managing a table on classification and component specific information and a table on component attribute data associated thereto, retrieves the three-dimensional component data or two-dimensional component data of this component and displays it on a screen, so that highly efficient high-speed data processing is enabled by dynamic data federation among a plurality of data display means, without increasing the data volume of an individual data display means.

In other words, the data federation system of the present invention is a data federation system for implementing data federation among a plurality of data display means having mutually independent databases respectively using a computer, comprising interface means, three-dimensional component data display means, two-dimensional component data display means, user data display means and federation control means.

Here the interface means is a means for inputting various instructions and data and performing screen display. The three-dimensional component data display means is a means further comprising a three-dimensional component database storing three-dimensional component data including classification of each component and component specific information, for displaying the three-dimensional component data on the screen by the interface means. The two-dimensional component data display means is a means further comprising a two-dimensional component database storing two-dimensional component data including classification of each component and component specific information, for displaying the two-dimensional component data on the screen by the interface means. The user data display means is a means further comprising a table on classification and component specific information extracted from the three-dimensional component database and the two-dimensional component database respectively, and a user database including a table on component attribute data associated thereto, for displaying the component attribute data on the screen by the interface means.

The federation control means is a means for controlling data federation among the three-dimensional component data display means, two-dimensional component data display means and user data display means. The federation control means further comprises a jump means which acquires classification or component specific information to indicate a specific component based on an instruction provided by the user via the interface means by using the table on classification and component specific information, retrieves the three-dimensional component database or two-dimensional component database targeting this specific component, and displays the retrieved three-dimensional component data or two-dimensional component data on this specific component on the screen by the interface means.

The control method and control program of the data federation system has the characteristics of the above system applied to the control method and computer programs respectively.

In the present invention, definitions of the major terms are as follows. "Component specific information" is a general concept including various information that can specify an individual component, such as a name, abbreviation, identification number, identification symbol and combination thereof of a component. "Three-dimensional component data" is data to represent a component by a three-dimensional image, and is a general concept including three-dimensional CAD data, three-dimensional review data and various types of three-dimensional image data. "Two-dimensional component data" is a data to represent a component by a two-dimensional image, and is a general concept including two-dimensional CAD data, two-dimensional drawing data and various types of two-dimensional image data.

"Data display means" is a means of display data specified by the user on the screen by the interface means by managing databases which are independent from each other, and performing interactive processing with the user independently via the interface means, and is a general concept including not only various types of data display tools implemented on hardware in software units, but also various types of data display devices or various types of data display system which are implemented in the units of hardware integrating software. "Database" is a set of data which is independently managed, and is not limited to a narrowly defined database system but is a general concept including data sets managed by various types of systems.

According to the above mentioned present invention, the user data display means and the three-dimensional component data display means or the two-dimensional component data display means can be dynamically data linked using the classification or component specific information of the component as the key data for linking, without converting and loading a large volume of image data, so data processing can be performed efficiently at high-speed without increasing the data volume to be handled by the three-dimensional component data display means or the two-dimensional component data display means.

In this case, the user can jump to the three-dimensional image display screen or the two-dimensional image display screen of a desired component merely by specifying classification or component specific information to indicate the specific component as the key data for linking using a table on classification and component specific information, so compared with the case of accessing in stages or sequentially by a walk through, the desired component image can be accessed and visually recognized much faster and much more easily. And because the display speed of a three-dimensional or two-dimensional image of a desired component can be decreased like this, the confirmation operation time for a three-dimensional or two-dimensional component image in the design field which handles large volumes of data, such as the case of plant design, can be decreased dramatically, and the operation efficiency can be remarkably improved accordingly.

According to the present invention, among a plurality of data display means having mutually independent databases respectively, a data federation system which can perform highly efficient and high-speed data processing by dynamic data federation among a plurality of data display means, and control method and control program thereof can be provided without increasing the data volume of an individual data display means.

BRIEF DESCRIPTION OF THE DRAWINGS

FIG. 12 shows screen display examples of the jump destination which are displayed as the jump execution result by the jump section in FIG. 1;

FIG. 14 shows screen display examples which are displayed as the attribute access execution result by the attribute access section in FIG. 1;

FIG. 16 shows a specific screen display example of the control screen for component color arrangement processing on time of delivery of the component, as the control screen for component color arrangement processing which is displayed by the component color arrangement section in FIG. 1.

DESCRIPTION OF THE PREFERRED EMBODIMENTS

System Configuration

Figure 1:
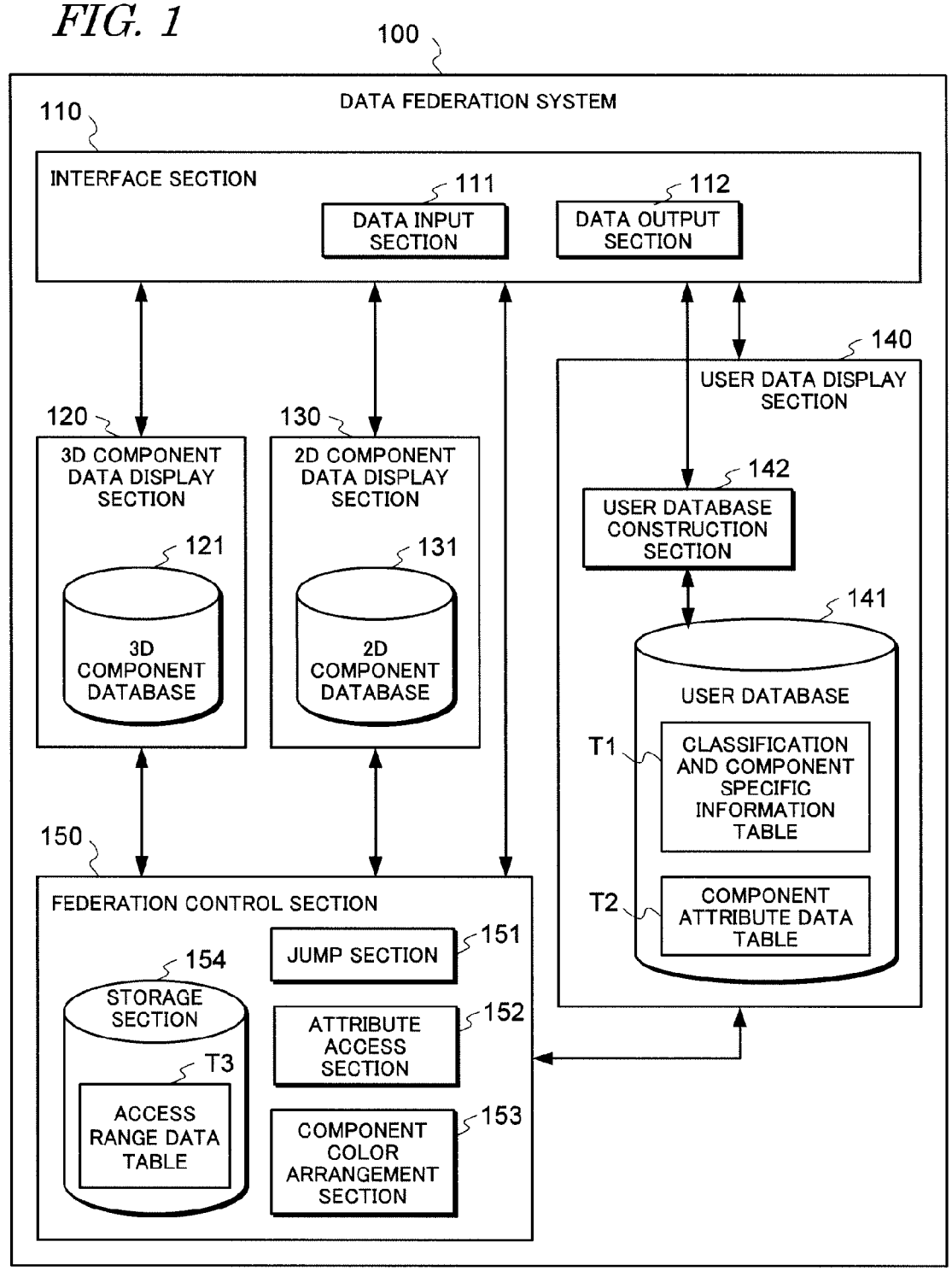
FIG. 1 is a block diagram depicting an embodiment of the data federation system according to the present invention.

FIG. 1 is a block diagram depicting an embodiment of the data federation system according to the present invention. As FIG. 1 shows, the data federation system 100 of the present embodiment is comprised of an interface section 110, three-dimensional component data display section 120, two-dimensional component data display section 130, user data display section 140 and federation control section 150 which are implemented on a computer. Details on each section 110, 120, 130, 140 and 150 follows.

The interface section 110 is comprised of a data input section 111 and data output section 112. Here the data input section 111 is an input device, such as a mouse and keyboard, for inputting various instructions and data according to the operation of the user to the computer, and the data output section 112 is an output device, such as a display and printer, for displaying or outputting data which was input by the data input section 111, data stored in the system and the result after processing data in the system. In other words, the interface section 110 is a section where the computer and the user exchange data, and is generally called the "user interface".

The three-dimensional component data display section 120 has a three-dimensional component database 121 for storing three-dimensional component data including classification and component specific information on each component, performs interactive processing with the user via the interface section 110, and displays the three-dimensional component data on the screen by the interface section 110.

The two-dimensional component data display section 130 has a two-dimensional component database 131 for storing two-dimensional component data including classification and component specific information on each component, performs interactive processing with the user via the interface section 110, and displays the two-dimensional component data on the screen by the interface section 110.

The user data display section 140 has a user database 141 including a classification and component specific information table T1 which indicates classification and component specific information extracted from the three-dimensional component database 121 and two-dimensional component database 131 respectively, and a component attribute data table T2 which indicates the component attribute data associated thereto, performs interactive processing with the user via the interface section 110, and displays the component attribute data on the screen by the interface section 110.

In the present embodiment, the user database 141 is constructed by the user database construction section 142 by loading data extracted from a plurality of data sources, which the user uses, in advance. This construction of the user database 141 is also implemented by interactive processing with the user via the interface section 110.

The three-dimensional component data display section 120, two-dimensional component data display section 130 and user data display section 140 are implemented by the main memory of the computer, individual programs customized for data display stored therein, and the CPU controlled by the program.

For a program to implement the three-dimensional component data display section 120, a conventional three-dimensional CAD tool and various three-dimensional review tools, for example, can be used, and for a program to implement the two-dimensional component data display section 130, a conventional two-dimensional CAD tool and various two-dimensional display tools can be used. The program to implement the user data display section 140 is a program customized for displaying the user data according to the present invention. Each database 121, 131 and 141 is implemented by various auxiliary storage devices, such as a hard disk, optical disk and magneto-optical disk.

The federation control section 150 is a section for controlling data federation among the three-dimensional component data display section 120, two-dimensional component data display section 130 and user data display section 140, and has a jump section 151, attribute access section 152, component color arrangement section 153 and storage section 154.

The jump section 151 acquires the classification and/or component specific information to indicate a specific component from the user via the interface section 110 using the classification and component specific information table T1 of the user data display section 140, retrieves the three-dimensional component database or two-dimensional component database targeting this specific component based on the acquired information, and displays the retrieved three-dimensional component data or two-dimensional component data of this specific component on the screen by the interface section 110.

The attribute access section 152 registers the access range data used for specifying the range of the component attribute data to be acquired from the component attribute data table T2 of the user data display section 140 in the access range data table T3 of the storage section 154, acquires attribute access range specification from the user via the interface section 110 using this access range data table T3, extracts the specified component attribute data of the attribute access range from the component attribute data table T2, and displays the extracted component attribute data or related data acquired using this component attribute data on the screen by the interface section 110.

This attribute access section 152 uses at least one of the registration methods to register the access image data: jump range registration method and user specified range registration method. In the case of the jump range registration method, classification and/or component specific information to indicate a specific component is acquired from the user using the jump section 151, and acquired information is registered when the three-dimensional component data or two-dimensional component data is displayed on the screen. In the case of the user specified range registration method, a specific range is specified by the user via the interface section 110 when the three-dimensional component data or two-dimensional component data is displayed on the screen by the interface section 110, and this range is registered as the user specified range information.

The component color arrangement section 153 acquires the color arrangement range and color arrangement specification from the user via the interface section 110 for the component data in the three-dimensional component database 121 or two-dimensional component database 131, extracts the component data in this specified color arrangement range from the three-dimensional component database 121 or two-dimensional component database 131, and displays the extracted component data on the screen by the interface section 110 using the specified color arrangement.

The above mentioned federation control section 150 is implemented by the main memory of the computer, a program customized for data federation stored thereto, and the CPU controlled by this program. Here the program to implement the federation control section 150 is a program customized for linking according to the present invention. The program to implement the jump section 151, attribute access section 152 and component color arrange section 153 constituting the federation control section 150 may be a mutually independent program, or may be integrated as a part of the program to implement the federation control section 150. The storage section 154 is implemented by various types of auxiliary storage devices, such as a hard disk, optical disk and magneto-optical disk.

[Details on Database]

[Configuration of User Database]

In the data federation system 100 according to the present embodiment, the user database 141 of the user data display section 140 is constructed by loading data extracted from a plurality of data sources, which are used by the user, in advance by the user database construction section 142.

The specific data to be used to construct the user database 141 is, for example, a spreadsheet and text data created by the user, or a database created by the user, or a spreadsheet, text and database created by other tools, devices and systems used by the user. Here the data generated by other tools, devices and systems include classification and component specific information extracted from the three-dimensional component data stored in the three-dimensional component database 121, and the classification and component specific information extracted from the two-dimensional component data stored in the two-dimensional component database 131.

[Example of User Database]

Figure 2:
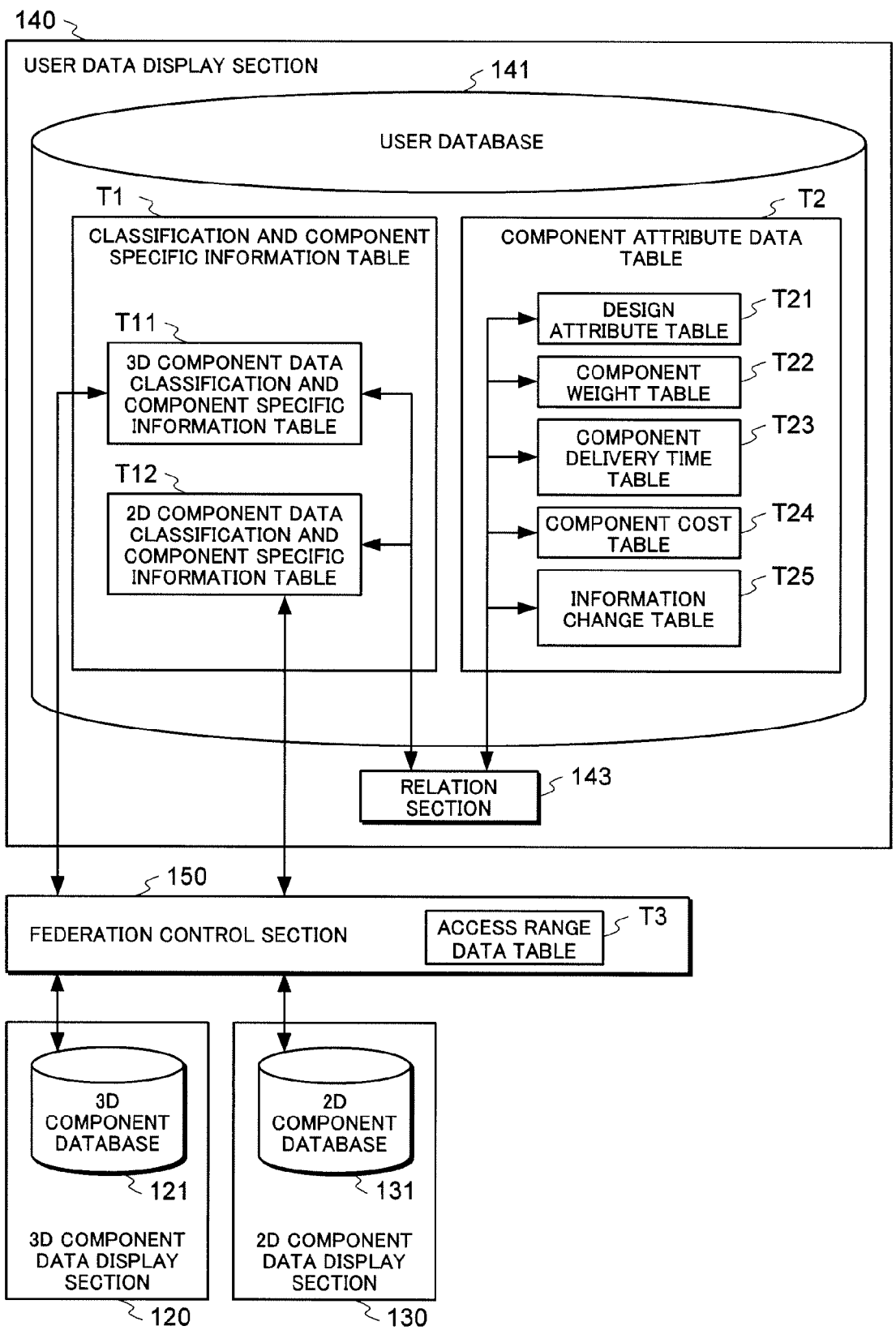
FIG. 2 is a block diagram depicting an example of the user database in FIG. 1, including the data federation inside and outside thereof.

FIG. 2 is a block diagram depicting an example of the user database on the plant design of a power plant, including data federations inside and outside thereof, as an example of the user database 141 to be constructed as above.

As FIG. 2 shows, in the user database 141, the classification and component specific information table T1 is comprised of a three-dimensional component data classification and component specific information table T11 to indicate classification and component specific information on the three-dimensional component data extracted from the three-dimensional component data stored in the three-dimensional component database 121, and two-dimensional component data classification and component specific information table T12 to indicate classification and component specific information of two-dimensional component data extracted from the two-dimensional component data stored in the two-dimensional component database 131.

In the user database 141, the component attribute data table T2 is comprised of a design attribute table T21 to indicate the design attribute data of components, component weight table T22 to indicate the weight data of components, component delivery time table T23 to indicate the delivery time data of components, and component cost table T24 to indicate the cost data of components. In the component attribute data table T2, the information change table T25 to indicate the content of the information change provided by the user for these individual tables T21 to T24 to indicate component attribute data is also prepared, and information is read into the other tables T21 to T24 with priority by an optional setting.

In the present embodiment, various tables constituting the user database 141 are prepared according to necessity, and all tables need not be prepared in advance, but at least the three-dimensional component data classification and component specific information table T11 and the two-dimensional component data classification and component specific information table T12 are tables required for implementing data federation according to the present invention.

In the plant design, it is preferable to prepare the design attribute table T21, component weight table T22, component delivery time table T23 and component cost table T24, since these are basically necessary component attribute data. These individual tables T21 to T24 to indicate the component attribute data and the information change table T25 are directly and indirectly data linked with the three-dimensional component data classification and component specific information table T11 and the two-dimensional component data classification and component specific information table T12 via the relation section 143 using the classification and component specific information of components.

[Overview of Data Federation Processing]

Figure 3:
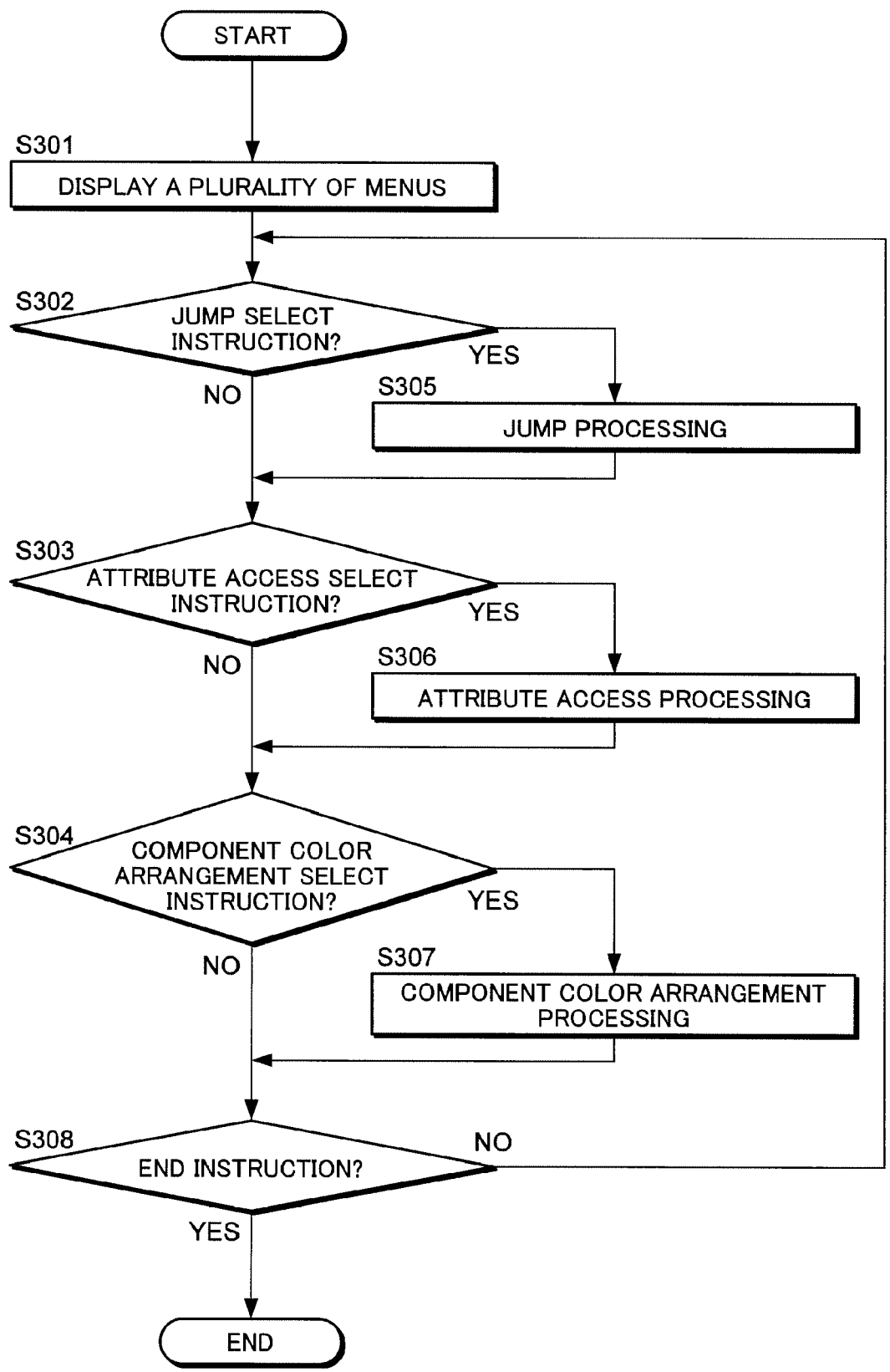
FIG. 3 is a flow chart depicting the data federation processing by the data federation system in FIG. 1.

FIG. 3 is a flow chart depicting an overview of the data federation processing by the data federation system 100 according to the present embodiment. In the present invention, the three-dimensional component data display section 120, two-dimensional component data display section 130, user data display section 140 and federation control section 150 display the control screen and result display screen on the screen by the interface section 110, and receives various instructions and data which are input via the interface section 110 by operation of the designer for image elements for operation, such as the input/select display fields and operation buttons, for setting target items displayed on the screen.

This operation of the interface section 110, image elements for operation, which are displayed on the screen, and operation of the designer to these elements are the general interactive input/output processing via the interface section 110. Therefore explanation on such general interactive input/output processing may be omitted in the following description in order to simplify description, and characteristic processing mainly related to operation, such as the three-dimensional component data display section 120, two-dimensional component data display section 130, user data display section 140 and federation control section 150 will be largely focused on in the description.

As FIG. 3 shows, in the data federation processing, a plurality of menus, such as jump, attribute access and component color arrangement are displayed on the screen by the federation control section 150 (S301), and when a specific menu selection instruction is input (YES in S302 to S304), the federation control section 150 displays the control screen of this menu, and executes this menu.

In other words, if a jump select instruction is input (YES in S302), jump section 151 displays the jump control screen and performs jump processing (S305), and if an attribute access select instruction is input (YES in S303), the attribute access section 152 displays the attribute access control screen, and performs attribute access processing (S306), and if a component color arrangement select instruction is input (YES in S304), the component color arrangement section 153 displays the component color arrangement control screen, and performs component color arrangement processing (S307).

Finally when the end instruction is input (YES in S308), the federation control section 150 ends the data federation processing.

In FIG. 3, only the basic operation flow is shown to simplify description, but actually an operation to switch an individual control screen or the result display screen to indicate the processing result by this control to another control screen is normally enabled.

[Details of Data Federation Processing]

Data federation processing by the data federation system of the present embodiment will now be described in detail.

[Jump Processing]

[Control Screen for Jump Processing]

Figure 4:
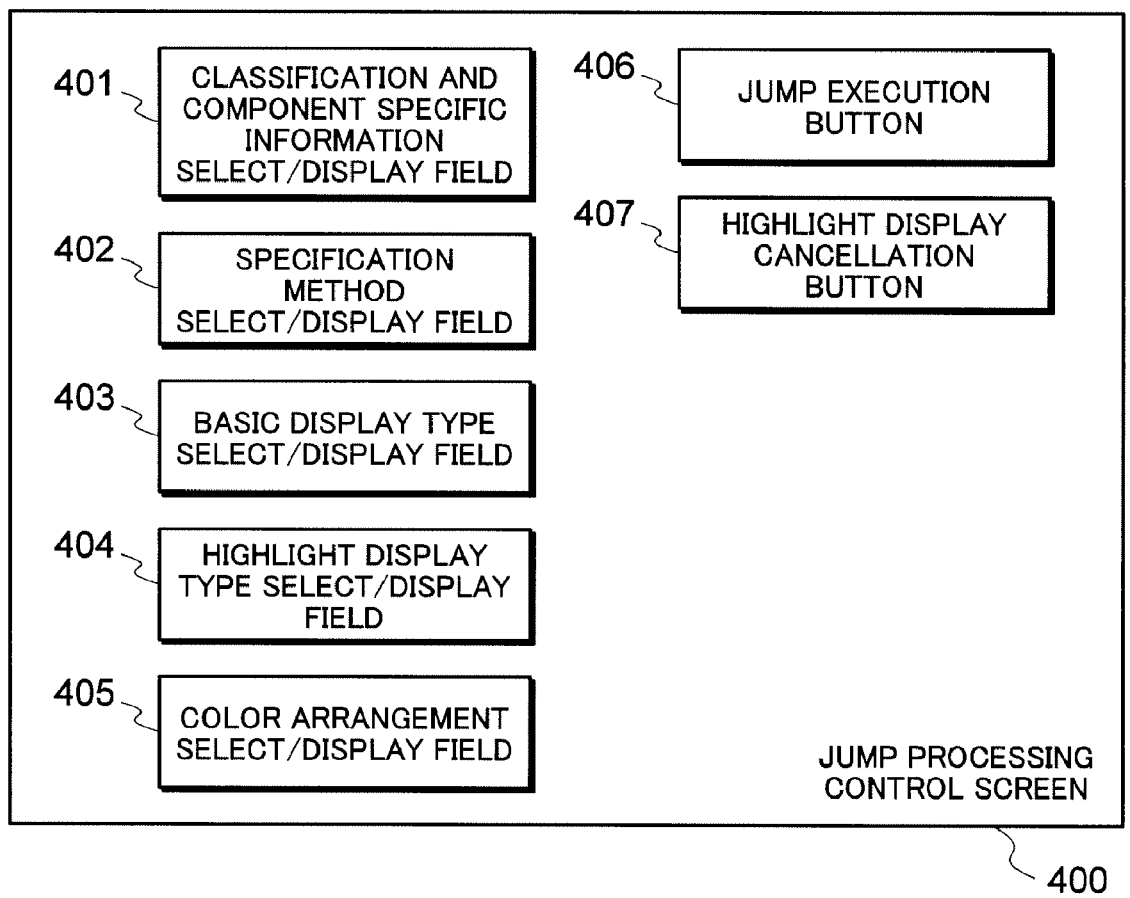
FIG. 4 is a diagram depicting an example of the functional configuration of the control screen for jump processing which is displayed by the jump section of the federation control section in FIG. 1.

FIG. 4 is a diagram depicting the functional configuration example of the jump processing control screen 400 which is displayed by the jump section 151 of the federation control section 150.

As FIG. 4 shows, the jump processing control screen 400 has a classification and component specific information select/display field 401 for specifying classification or component specific information, and a specification method select/display field 402 for specifying the component specific information specification method, in order to specify the classification and/or component specific information of a target component data, which is the display target.

The jump processing control screen 400 also has a basic display type select/display field 403, highlight display type select/display field 404 and color arrangement select/display field 405 for specifying the display conditions on the component data. Here the basic display type select/display field 403 is for specifying a basic display type of the component, such as the display size of the component, degree of distance to the component, and display direction, as essential information.

The highlight display type select/display field 404, on the other hand, is for specifying the highlight display type of the component, whether only the specified components are displayed or the component is highlighted by color arrangement, as optional information. The color arrangement select/display field 405 is for specifying the color arrangement of a specified component as optional information, and also for specifying the color arrangement of other components if these components are to be displayed and the color arrangement thereof is specified.

The jump processing control screen 400 also has a jump execution button 406 for executing jump to the three-dimensional or two-dimensional component data display screens of the specified component based on the information specified by each select/display field 401 to 405, and highlight display cancellation button 407 for canceling the color arrangement and highlight display type displayed by jump execution.

[Flow of Jump Processing Using Control Screen]

Figure 5:
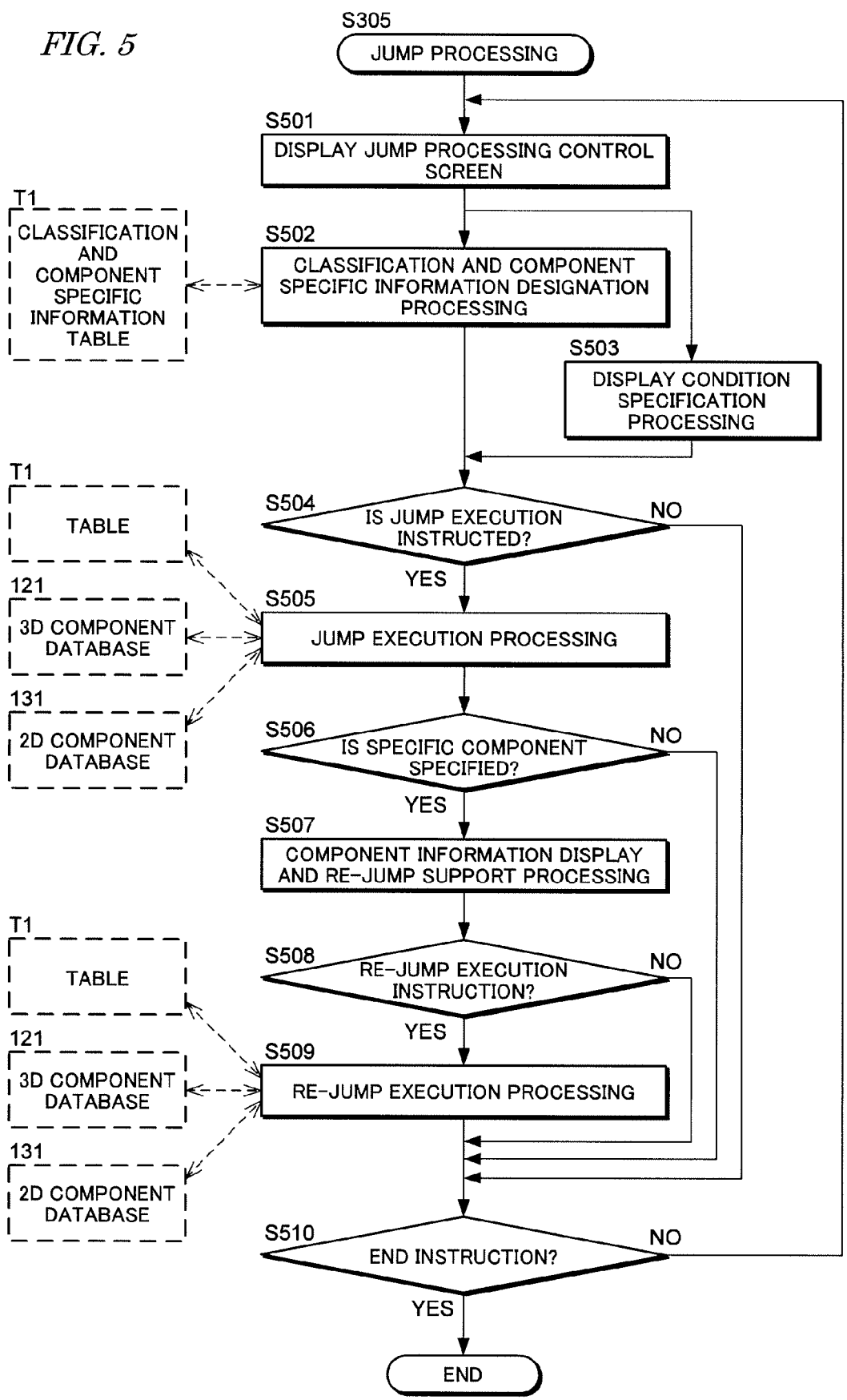
FIG. 5 is a flow chart depicting an example of the flow of the jump processing by the jump section of the federation control section in FIG. 1 using the control screen for jump processing in FIG. 4.

FIG. 5 is a flow chart depicting an example of the jump processing (S305 in FIG. 3) using the jump processing control screen 400 shown in FIG. 4, which is executed by the jump section 151 of the federation control section 150.

As FIG. 5 shows, the jump section 151 displays the jump processing control screen 400 (S501), and executes the classification and component specific information designation processing (S502) by the classification and component specific information select/display field 401 and the specification method select/display field 402, and display condition specification processing (S503) by the basic display method select/display field 403, highlight display type select/display field 404 and color arrangement select/display field 405 in parallel.

Figure 6:
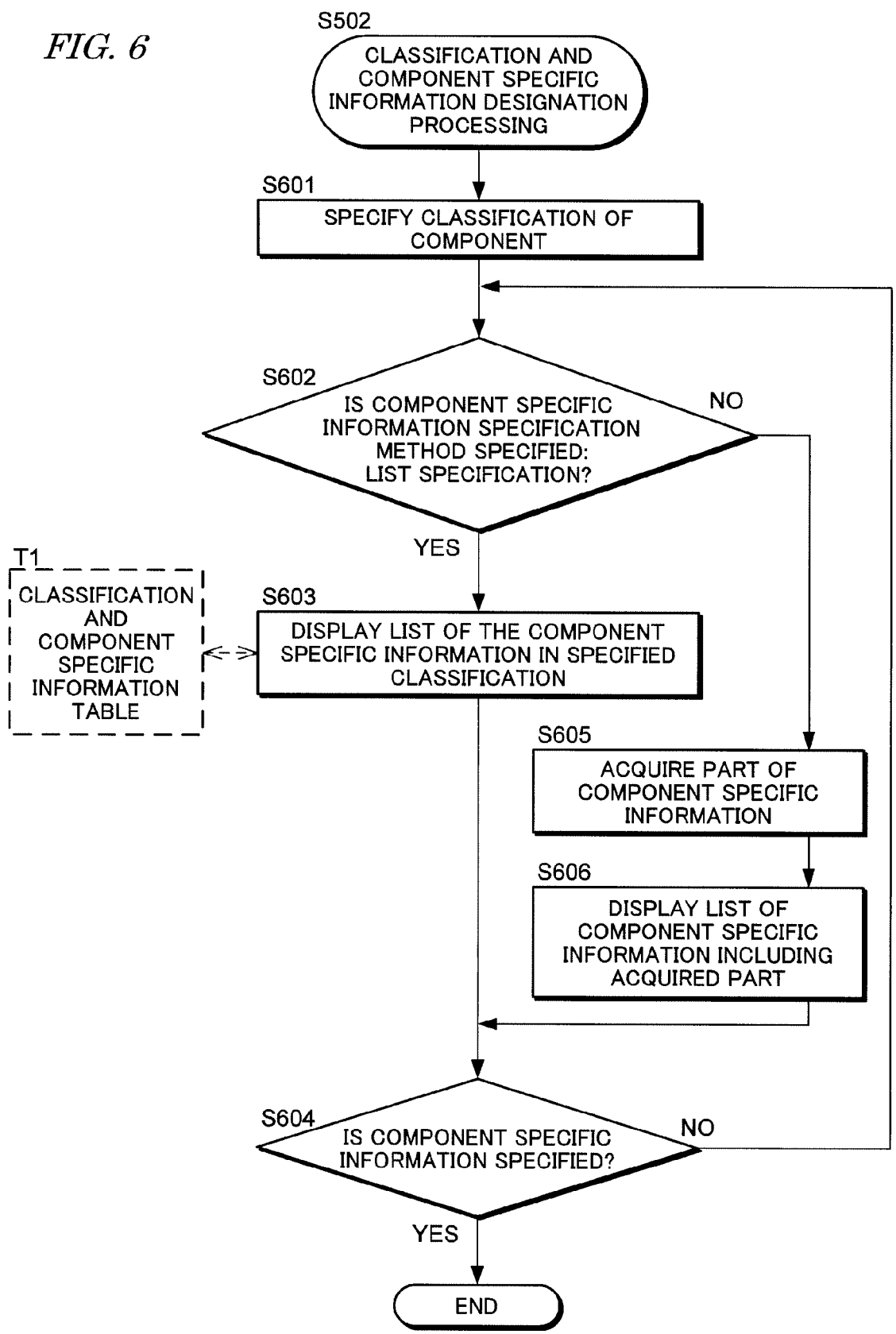
FIG. 6 is a flow chart depicting an example of the flow of the classification and component specific information designation processing in FIG. 5.

FIG. 6 is a flow chart depicting an example of the flow of the classification and component specific information designation processing (S502). As FIG. 6 shows, in the classification and component specific information designation processing (S502), the jump section 151 first specifies the classification of the component by the classification and component specific information select/display field 401 as the essential information for jump execution (S601), and specifies the component specific information specification method by the specification method select/display field 402 (S602) based on the select operation or input operation of the user.

If a list specification is specified (YES in S602), for example, as the specification method of the component specific information, a list of the component specific information in the specified classification is created from the classification and component specific information table T1 of the user database 141, and is displayed on the screen (S603), and the component specific information is specified as the essential information for jump execution (YES in S604) based on the select operation of the user for the screen display of this list.

If a partial input specification is instructed as the specification method by the classification and specification method select/display field 402, for example (NO in S602), based on the select operation or input operation of the user, a part or all of component specific information is acquired based on the input operation of the user (S605), and if the acquired component specific information is a part of the information, a list of the component specific information including this acquired part is created from the classification and component specific information table T1 of the user database 141, and is displayed on the screen (S606), and the component specific information is specified as the essential information for jump execution (YES in S604) based on the select operation of the user for the screen display of this list.

In the display condition acquisition processing (S503), the jump section 151 specifies display conditions, such as the display method of component and color arrangement by the basic display method select/display field 403, highlight display method select/display field 404 and color arrangement select/display field 405, as essential information and optional information for jump execution.

In other words, based on the select operation or input operation of the user, the basic display method of components, such as display size of the component, degree of distance to the component and display direction, is specified as essential information for jump execution by the basic display method select/display field 403. Also based on the select operation or input operation of the user, the highlight display method of components, on whether only the specified components are displayed or the component is highlighted by color arrangement, is specified as optional information for jump execution by the highlight display method select/display field 404. Also based on the select operation or input operation of the user, color arrangement of the specified component is specified as the optional information for jump execution by the color arrangement select/display field 405, and if other components are displayed, color arrangement thereof is specified as optional information for jump execution.

In the above display condition specification processing (S503), if the user does not perform select operation or input operation on the basic display method, which is essential information, default setting information which is preset or information on a previously selected setting may be used for automatic specification. If the user does not perform operation for optional information, such as highlight display method and color arrangement of components, on the other hand, "no highlight display" or "no color arrangement" may be specified in the subsequent processing.

In the stage when various information to be used for jump execution are specified (S502, S503), if the jump execution button 406 is pressed by the user and therefore jump execution is instructed (YES in S504), the jump section 151 performs jump execution processing to the three-dimensional and two-dimensional component data image display screen of the specified component (S505).

In this jump execution processing (S505), the jump section 151 first extracts the component specific information specified from the classification and component specific information table T1 of the user database 141. And the jump section 151 controls the three-dimensional component data display section 120 or two-dimensional component data display section 130, retrieves the three-dimensional component data or two-dimensional component data including extracted component specific information from the three-dimensional component database 121 or two-dimensional component database 131, and displays the retrieval three-dimensional component data or two-dimensional component data on the three-dimensional image display screen or two-dimensional image display screen based on the specified display conditions. If highlight display method and color arrangement have been specified in this case, the component is highlight displayed according to these display conditions.

If the user presses the highlight display cancellation button 407, and therefore highlight display cancellation is instructed after highlight display method and color arrangement are specified in the display condition specification processing (S503), the jump section 151 cancels the specification of highlight display method and color arrangement. In other words, the color arrangement specification specified by the color arrangement select/display field 405 is cancelled, and the highlight display method specification specified by the highlight display method select/display field 404 is cancelled.

If a specific component is specified on the three-dimensional image display screen or two-dimensional image display screen displayed by the three-dimensional component data display section 120 or two-dimensional component data display section 130 based on the select operation of the user (YES in S506) as a result of the jump execution processing (S505), the jump section 151 performs component information display and re-jump support processing for this component (S507).

In this component information display and re-jump support processing (S507), the jump section 151 first displays classification and component specific information on this component, various component attribute data and various other data associated with this component. And for this display, if a re-jump execution instruction is acquired along with various information for re-jump execution including specification of component specific information of the three-dimensional component data or two-dimensional component data to indicate this component (YES in S508) based on the select operation or input operation of the user, the jump section 151 performs re-jump execution processing (S509) to the image display screen of the three-dimensional component data or two-dimensional component data including this component specific information.

This re-jump execution processing (S509) enables jump among a plurality of different types of data display sections, such as between the three-dimensional component data display section 120 and two-dimensional component data display section 130. In other words, jump among a plurality of different types of image display screens for displaying different three-dimensional data or two-dimensional data, such as jump between image display screen of the three-dimensional review data and two-dimensional drawing data, jump between image display screen between three-dimensional review data and three-dimensional CAD data, and jump between image display screen of two-dimensional drawing data and two-dimensional CAD data, is enabled.

Finally when the end instruction is input (YES in S510), the jump section 151 ends the jump processing.

[Effects of Jump Processing]

By performing the above jump processing by the jump section 151 of the federation control section 150, the following effect is implemented.

In other words, data can be linked among the user data display section, three-dimensional component data display section and two-dimensional component data display section using classification and/or component specific information of the component as the key data for linking, without converting and loading large volumes of image data, data processing can be performed efficiently at high-speed without increasing the data volume to be handled by the three-dimensional component data display section or two-dimensional component data display screen.

In this case, the user can jump to a desired three-dimensional image display screen or two-dimensional image display screen merely by specifying a classification or component specific information to indicate a specific component, using the classification and component specific information table, so compared with the case of accessing in stages or sequentially by walk through, the desired component image can be accessed and visually recognized much faster and much more easily. Since the display speed of the three-dimensional and two-dimensional images of a desired component can be decreased like this, confirmation operation time for three-dimensional or two-dimensional component images in a design field which handles large volumes of data, such as plant design, can be dramatically decreased, and operation efficiency can be remarkably improved accordingly.

Also not only by jump by specifying classification or component specific information on the control screen, but also by simply specifying the component or range on the image display screen at the jump destination, the user can jump to a different type image display screen which displays different three-dimensional data or two-dimensional data for this component or range, so a plurality of types of different three-dimensional data images or two-dimensional data images can be accessed and visually recognized one after another in a short time. By this, confirmation operation time for a plurality of types of different three-dimensional or two-dimensional component images can be dramatically decreased, and operation efficiency can be further improved accordingly.

When the classification or component specific information is specified, not only is the component specific information specified by displaying the component specific information list in this classification after limiting the range of the component specific information by specifying the classification, but also the component specific information can be partially input, so if there are many component specific information in this classification, the user can input a part of the component specific information so as to limit the range of the corresponding component specific information. Since the user can select either list specification or partial input, component specific information can be specified using the specification method according to the situation.

Also various display conditions of the component data can be acquired using not only classification and component specific information, but a plurality of select/display fields, such as basic display method select/display field, highlight display method select/display field and color arrangement select/display field, and the display of the component data can be controlled based on the acquired display conditions, so the user can not only specify the basic display method, such as the display size of the component, degree of distance to the component and display direction, but also can specify the highlight display method, including color arrangement.

In other words, the user can select the highlight display method of a display target component data whether only this component is displayed or the component is highlighted by color arrangement, and also not only can the color arrangement of this component be selected, but also the color arrangement of other components can be selected. Therefore the user can freely display the target three-dimensional and two-dimensional component images using a highlight display method which the user can easily recognize visually, so the confirmation operation of the three-dimensional and two-dimensional component images can be performed very easily, and the load of the visual confirmation operation can be dramatically decreased, which further improves operation efficiency. Also the highlight display can be cancelled, so a more flexible confirmation operation can be possible.

[Effect when Present Invention is Applied to Plant Design]

Particularly when the jump processing by the above jump section 151 of the federation control section 150 is applied to plant design, the following effects are implemented.

In plant design, a plurality of data display tools, including three-dimensional CAD and two-dimensional CAD, for example, can be organically linked with the three-dimensional review tool at the center. In other words, under a standard three-dimensional review function, such as walk through, which is a characteristic function of a three-dimensional review tool, the following functions can be implemented.

When the component specific information, such as component name, which is input by the three-dimensional CAD, for example, is specified on the control screen or another image display screen, such as a three-dimensional review tool, jump to this component on the three-dimensional CAD model data is possible. In this case the component specific information, such as component name, can be specified by, for example, a method of retrieving it from a list, a method of directly inputting it, a method of retrieving a list limited by partial input, and a method of specifying the component on an image display screen, such as a system diagram display screen.

In this case, the key data for linking, which is classification and/or component specific information, is extracted from the three-dimensional CAD in advance, and the classification and component specific information table is created, and a retrieval key for linking with the upstream data display tool is provided and associated with the classification and component specific information table of other tools, so that the retrieval key of the three-dimensional CAD and the linked data display tool or the linked component are associated. As a result, the key data for linking downstream data can be picked up by the key data for linking acquired from upstream, and can be confirmed on the data display tool downstream.

If valve and instrumentation information are integrated into a system diagram, the integrated key data can be freely acquired by specifying the range, so this key data is acquired as upstream key data, interpreted as the key data for linking, and transferred to the downstream three-dimensional review tool. As a result, only by picking up a component in the system diagram, a jump to this component in the three-dimensional review tool is possible. Particularly an instrumentation and trial run engineer at the construction site frequently operates based on a system diagram, so a jump from the system diagram, as described above, leads to an improvement of operation efficiency.

Also for all components, an attribute is assigned along with the component specific information, such as name, so an attribute such as component specification can be visualized merely by clicking a component on the image display screen. For example, if such information as the setting pressure and temperature of internal fluid, the material, thickness and inspection method are prepared as a component attribute data table, for example, this information can be visualized and easily recognized.

Another major advantage is that further jumping is possible even after a jump to a data display tool downstream. For example, a plurality of jumps can be executed in parallel, such as acquiring a drawing image registered in an electronic document management system, and displaying the CAD data related to the component, so a plurality of related image data can be confirmed in parallel.

[Attribute Access Processing]

[Control Screen for Attribute Access Processing]

Figure 7:
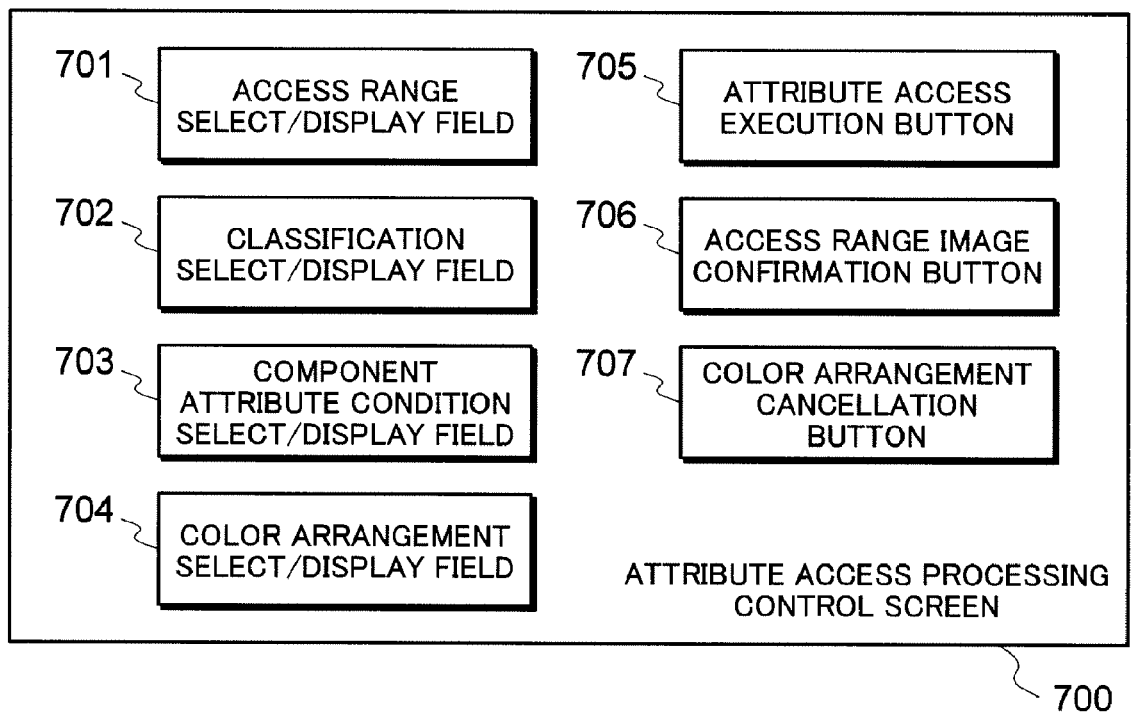
FIG. 7 is a diagram depicting an example of the functional configuration of the control screen for attribute access processing which is displayed by the attribute access section of the federation control section in FIG. 1.

FIG. 7 is a diagram depicting an example of the functional configuration of the control screen 700 for attribute access processing, which is displayed by the attribute access section 152 of the federation control section 150.

As FIG. 7 shows, the attribute access processing control screen 700 has an access range select/display field 701 for specifying the access range data to be used for range specification of the component attribute data as essential information for attribute access execution.

Each time data to be the registration target is acquired during system operation, the attribute access section 152 registers the access range data to the access data range table T3 of the storage section 154 by two methods: jump range registration method, and user specified range registration method, according to the data and acquisition cause.

In the case of the jump range registration method, the classification and/or component specific information to indicate a specific component acquired from the user is registered when jump processing is performed by the jump section 151. In the case of the user specified range registration method, the user specified range information is registered when the user specified range information to specify a specific range is acquired on the image display screen of the three-dimensional component data or two-dimensional component data displayed by jump processing or other processing based on the select operation or input operation of the user.

The attribute access processing control screen 700 also has a classification select/display field 702 for specifying the classification of component attribute data in a range for specifying the limit conditions in the range specified by the access range data as optional information for attribute access execution, and component attribute condition select/display field 703 for specifying the component specific information of the component attribute data in this range, the numeric limitation and periodic limitation. The attribute access processing control screen 700 also has the color arrangement select/display field 704 for specifying the color arrangement of this component and color arrangement of other components as optional information for image confirmation, so as to be the display conditions of the three-dimensional component data or two-dimensional component data of components included in the access range.

The attribute access processing control screen 700 also has an attribute access execution button 705 for executing access of specified component attribute data based on the information specified by each of the above select/display fields 701 to 704, an access range image confirmation button 706 for executing image confirmation processing of the access range based on the specification of the color arrangement by the color arrangement select/display field 704, and the color arrangement cancellation button 707 for canceling the specification of the color arrangement by the color arrangement select/display field 704.

[Flow of Attribute Access Processing]

Figure 8:
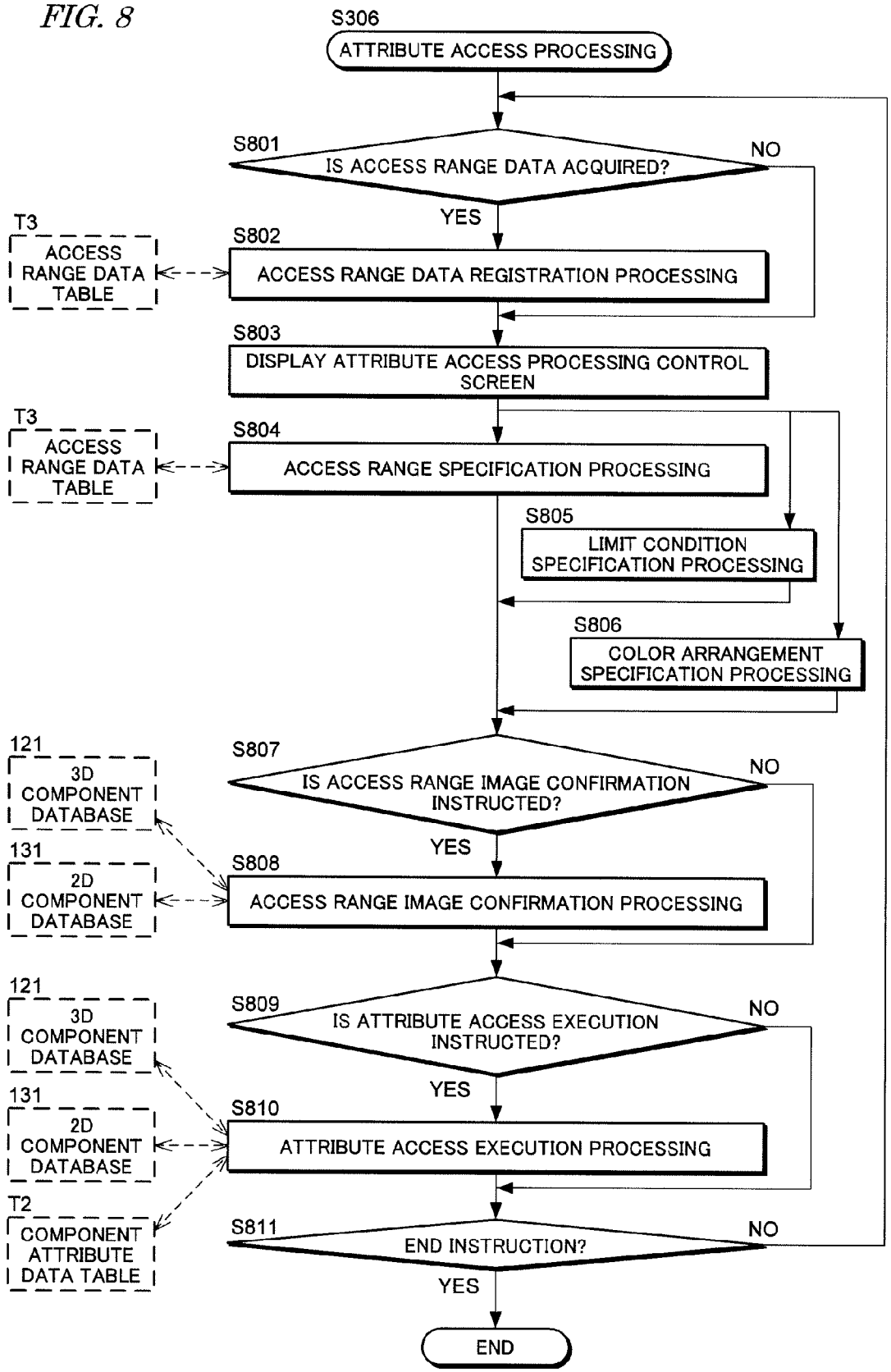
FIG. 8 is a flow chart depicting an example of the flow of attribute access processing by the attribute access section of the federation control section in FIG. 1, using the control screen for attribute access processing in FIG. 7.

FIG. 8 is a flow chart depicting an example of the flow of attribute access processing (S306 in FIG. 3) by the attribute access section 152 of the federation control section 150, using the attribute access processing control screen 700 in FIG. 7.

As FIG. 8 shows, each time access range data is acquired (YES in S801), the attribute access section 152 performs access range data registration processing for registering the access range data in the access range data table T3 of the storage section 154 by the jump registration method or user specified range registration method (S802).

In other words, if classification and/or component specific information is acquired from the user by performing jump processing by the jump section 151, the acquired information is registered in the access range data table T3 with the original registration name or assigning another registration name as the jump registration type registration. If the user specified range information specifying a specific range is acquired on the display and image display screen of the three-dimensional component data or two-dimensional component data based on the select operation or input operation of the user, a registration name is assigned to this user specified range information, and this information is registered to the access range data table T3 as a user specified range registration type registration.

The attribute access section 152 displays the attribute access processing control screen 700 (S803), and performs access range specification processing by the access range data select/display field 701 (S804), limit condition specification processing by the classification select/display field 702 and component attribute condition select/display field 703 (S805), and color arrangement specification processing by the color arrangement display field 704 (S806) in parallel.

In the access range specification processing (S804), the attribute access section 152 creates a list of registration names of the access range data from the access range data table T3 of the storage section 154, displays it by the access range select/display field 701, and specifies the access range data as the essential information for attribute access execution based on the select operation or input operation of the user.

In the limit condition specification processing (S805), the attribute access section 152 specifies the classification of component attribute data in the specified access range and other limit conditions as the optional information for attribute access execution by the classification select/display field 702 and component attribute condition select/display field 703.

In other words, based on the select operation or input operation of the user, the classification of the component attribute data in the specified access range by the classification select/display field 702 is specified as the optional information for attribute access execution. Also based on the select operation or input operation of the user, component specific information of the component attribute data in the specified access range and component attribute conditions such as numeric limit and periodic limit are specified as optional information for attribute access execution by the component attribute condition select/display field 703.

Various limit conditions which are specified in the limit conditions specification processing (S805) are optional information for attribute access execution, so if the select operation or input operation of the user is not performed, "no limit conditions" is set in subsequent processing.

In the color arrangement specification processing (S806), based on the select operation or input operation of the user, the attribute access section 152 specifies the color arrangement of this component and color arrangement of the other components as optional information for access range image confirmation for the components in the color arrangement of the access range data by the color arrangement select/display field 704.

In this way, in the stage of specifying various information on the access range to be used for attribute access (S804 to S806), if a user presses the access range image confirmation button 706 and therefore the access range image confirmation is instructed (YES in S807), the attribute access section 152 performs the access range image confirmation processing (S808).

In other words, in the access range image confirmation processing (S808), the attribute access section 152 controls the three-dimensional component data display section 120 or two-dimensional component data display section 130, and retrieves the three-dimensional component data or two-dimensional component data in the specified access range from the three-dimensional component database 121 or two-dimensional component database 131, and highlight displays the retrieved three-dimensional component data or two-dimensional component data on the three-dimensional image display screen or two-dimensional image display screen using the specified color arrangement. By performing this access range image confirmation processing (S808), the user can easily confirm the component image of the specified access range by the highlight display based on the specified color arrangement.

If the user presses the color arrangement cancellation button 707 and therefore the color arrangement cancellation is instructed after color arrangement is specified in the color arrangement specification processing (S806), the attribute access section 152 cancels the specification of the color arrangement specified by the color arrangement select/display field 704.

As described above, when information required for attribute access, at least access range, is specified (S804), if the user presses the attribute access execution button 705 and therefore the attribute execution is instructed (YES in S809), the attribute access section 152 performs attribute access execution processing using the component attribute data in the specified access range (S810).

In this attribute access execution processing (S810), the attribute access section 152 first controls the three-dimensional component data display section 120 or two-dimensional component data display section 130 so that the classification and/or component specific information included in the specified access range are retrieved and extracted from the three-dimensional component database 121 or two-dimensional component database 131. In this case, if limit conditions are specified, extraction is performed limiting to classification and component specific information, which satisfy these limit conditions. And the component attribute data in this access range is extracted from the component attribute data table T2 of the user database 141 using the extracted classification and component specific information, and the extracted component attribute data and related data acquired using the component attribute data are displayed on the screen as the attribute access result.

Here the data displayed on the screen as the attribute access result is an attribute table, for example, which is created using the component attribute data. The component attribute data may be sent to another means which has a database or performs data processing, and the data acquired as a response from this other means may be displayed.

Finally when the end instruction is input (YES in S811), the attribute access section 152 ends the attribute use processing.

[Effect of Attribute Access Processing]

By performing attribute access processing using the above mentioned attribute access section 152 of the federation control section 150, the following effects are implemented.

The classification and component specific information the user specified in jump processing or the user specified range information to indicate the range that the user specified to access attributes can be used as the access range to extract the component attribute data in this access range, and the user can use the component attribute data in this range for various applications by merely specifying the attribute access range using the registered access range data.

Specifically, an attribute table created using the component attribute data can be displayed in a spreadsheet. The component attribute data can be used not only directly, but the component attribute data can be sent to another data processing tool for managing various drawings of a component, so that bird's eye view, plan view, front view and side view images are acquired and documented with added comments.

The user can not only specify the attribute access range, but can also specify the classification of components, component specific information and limit conditions, such as the numeric limit and periodic limit, related to the component attribute, so data can be efficiently limited according to the purpose of use of the component attribute data.

The user can not only confirm the component in the specified attribute access range by three-dimensional and two-dimensional component images, but also specify the color arrangement of the components in this range in three-dimensional or two-dimensional images, so by freely displaying the three-dimensional or two-dimensional component images in this range by color arrangement which the user can visually recognize easily, a confirmation operation in this range using the three-dimensional or two-dimensional component images can be performed very easily. Therefore load on the visual confirmation operation is dramatically decreased, which improves operation efficiency. Also the specification of the color arrangement can be cancelled, so a further flexible confirmation operation becomes possible.

[Component Color Arrangement Processing]

[Control Screen for Component Color Arrangement Processing]

Figure 9:
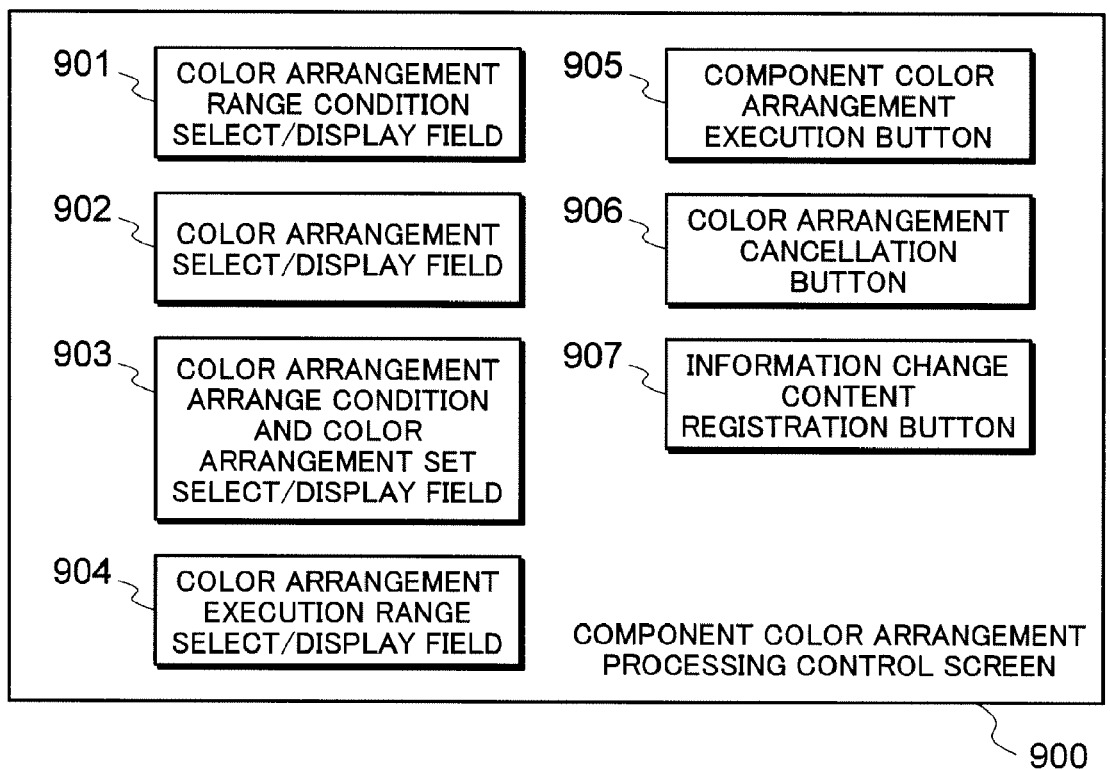
FIG. 9 is a diagram depicting an example of the functional configuration of the control screen for component color arrangement processing which is displayed by the component color arrangement section of the federation control section in FIG. 1.

FIG. 9 is a diagram depicting an example of the functional configuration of the component color arrangement processing control screen 900 which is displayed by the component color arrangement section 153 of the federation control section 150.

As FIG. 9 shows, the component color arrangement processing control screen 900 has a color arrangement range condition select/display field 901 for specifying the color arrangement range conditions including classification of component, component specific information and numeric limit and periodic limit of the component attribute data as essential information for compound color arrangement. The component color arrangement processing control screen 900 also has a color arrangement select/display field 902 for specifying the color arrangement of this component and color arrangement of other components to be used for display conditions for the three-dimensional component data or two-dimensional component data of components included in the color arrangement range as essential information for component color arrangement.

When the entire distribution of contour is shown, the color arrangement arrange condition and color arrangement set select/display field 903 for specifying a plurality of color arrangement range conditions for specifying classification of component, component specific information and numeric limit and periodic limit of the component attribute data, and the color arrangement of the components that matches each condition, as a plurality of sets, as essential information for component color arrangement, is provided, instead of the color arrangement range select/display field 901 and color arrangement select/display field 902.

The component color arrangement processing control screen 900 also has a color arrangement execution range select/display field 904 for specifying color arrangement range on whether the components to be actually color arranged and displayed are limited to the specified range, or all components are color arranged, as essential information for component color arrangement.

The component color arrangement processing control screen 900 also has a component color arrangement execution button 905 for executing the display of component data in the specified color arrangement in the specified color arrangement change range based on the information specified by each of the above select/display fields 901 to 904, and a color arrangement cancellation button 906 for canceling the specification of color arrangement by the color arrangement select/ display field 902, or the color arrangement range condition and color arrangement set select/display field 903.

The component color arrangement processing control screen 900 also has an information change content registration button 907 for registering the information change content provided by the user on the various component attribute information to be color arrangement range conditions, such as numeric limit and periodic limit of the component attribute data, into the information change table T25 (FIG. 2) of the user database 141, so as to be used for component color arrangement.

[Flow of Component Color Arrangement Processing]

Figure 10:
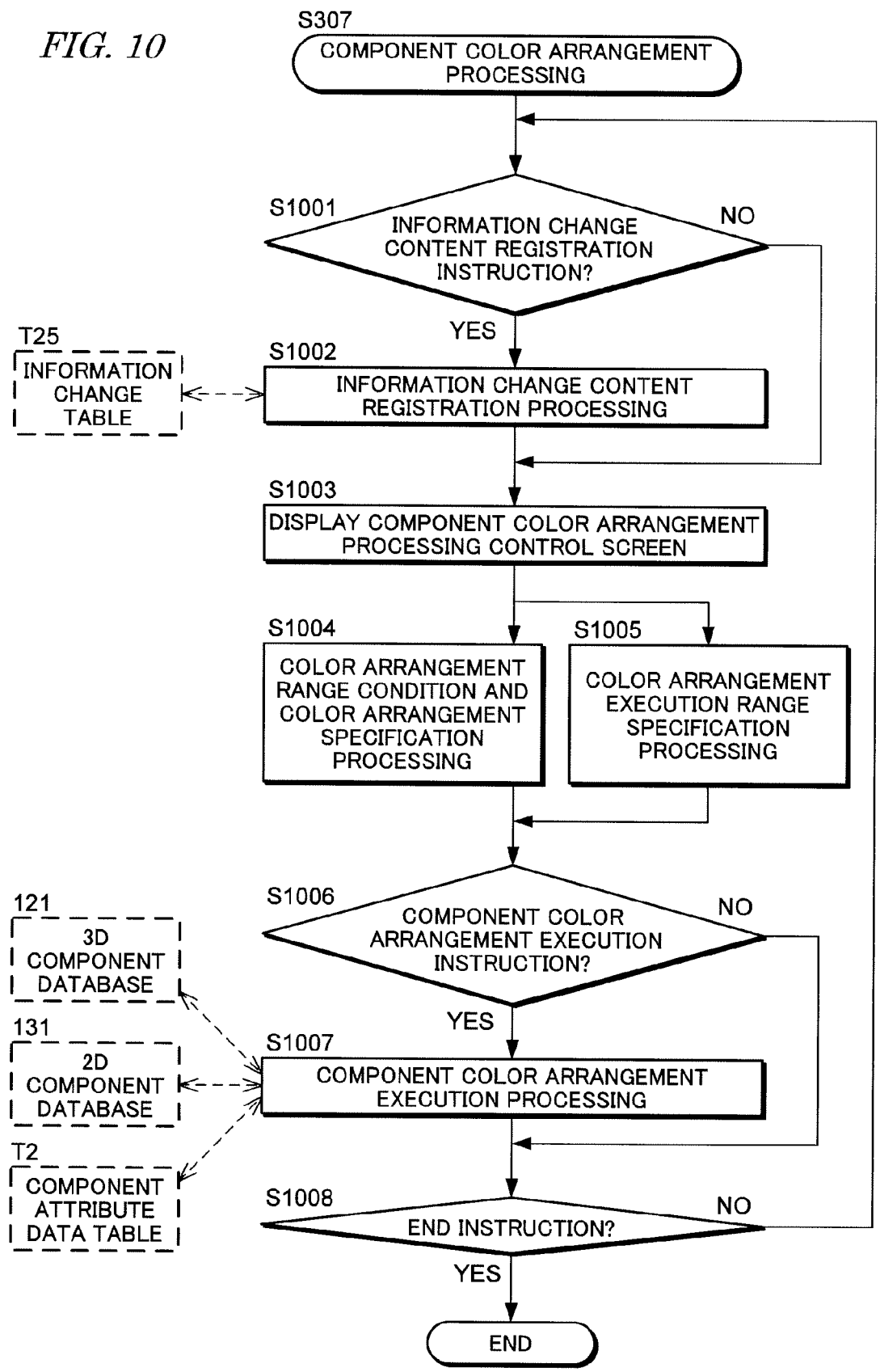
FIG. 10 is a flow chart depicting an example of the flow of the component color arrangement processing by the component color arrangement section of the federation control section in FIG. 1, using the control screen for component color arrangement processing in FIG. 9.

FIG. 10 is a flow chart depicting an example of the flow of the component color arrangement processing (S307 in FIG. 3) by the component color arrangement section 153 of the federation control section 150, using the component color arrangement processing control screen 900 in FIG. 9.

As FIG. 10 shows, when an information change content registration instruction is provided by the user (YES in S1001), the component color arrangement section 153 registers the correction data, which indicates the information change content, provided by the user into the information change table T25 (FIG. 2) of the user database 141 by the information change content registration button 907 so as to be used for component color arrangement (S1002).

The component color arrangement section 153 also displays the component color arrangement processing control screen 900 (S1003), performs color arrangement range conditions and color arrangement specification processing (S1004) by the color arrangement range condition select/display field 901, color arrangement select/display field 902, or color arrangement range condition and color arrangement set select/display field 903, and performs the color arrangement execution range specification processing (S1005) by the color arrangement execution range select/display field 904 in parallel.

In the color arrangement range condition and color arrangement specification processing (S1004), the component color arrangement section 153 specifies the color arrangement range conditions including classification of components, component specific information, numeric limits and periodic limits of the component attribute data, and color arrangement of components included in the color arrangement range and color arrangement of the other components as essential information for component color arrangement by the color arrangement range condition select/display field 901 and color arrangement select/display field 902 based on the select operation or input operation of the user. When the entire contour description is shown, the component color arrangement section 153 specifies a plurality of color arrangement range conditions and color arrangement of components matching each condition by the color arrangement range condition and color arrangement set select/display field 903 as a plurality of sets, as essential information for component color arrangement based on the select operation or input operation of the user.

Also in the color arrangement execution range specification processing (S1005), the component color arrangement section 153 specifies the color arrangement execution range on whether components to be actually color arranged and displayed by the color arrangement execution range select/display field 904 are limited to the range specified by the color arrangement range conditions or all components are color arranged, as essential information for component color arrangement.

If the user presses the color cancellation button 906 and therefore the color arrangement cancellation is instructed after color arrangement is specified in the color arrangement range condition and color arrangement specification processing (S1004), the component color arrangement section 153 cancels the specified color arrangement by the color arrangement select/display field 902 or color arrangement range condition and color arrangement set select/display field 903.

In the stage when the color arrangement range conditions and color arrangement are specified and the color arrangement execution range is specified as described above (S1004, S1005), if the user presses the component color arrangement execution button 906 and therefore the component color arrangement execution is instructed (YES in S1006), the component color arrangement section 153 performs the component color arrangement execution processing for arranging colors of components in the specified range (S1007).

In this component color arrangement execution processing (S1007), the component color arrangement section 153 retrieves the three-dimensional component database 121 or two-dimensional component database 131, and extracts the classification and/or component specific information of component data included in the range specified by the color arrangement execution range by controlling the three-dimensional component data display section 120 or two-dimensional component data display section 130. In other words, if the color arrangement execution range is a range specified by the color arrangement range condition, the classification and component specific information of component data are extracted only in this range. If the color arrangement execution range is the entire range, the classification and component specific information of all component data are extracted from the three-dimensional component database 121 or two-dimensional component database 131.

And the component attribute data in this range is extracted from the component attribute data table T2 of the user database 141 using the extracted classification and component specific information, and it is judged whether each component satisfies the color arrangement range conditions using the extracted component attribute data, and only component data satisfying the color arrangement conditions (three-dimensional component data or two-dimensional component data) are color arranged according to the specification and displayed on the screen.

When the component attribute data is extracted from the component attribute data table T2, if correction data to indicate the information change content of such data as design attribute, component weight, component delivery time and component cost to be extracted has been registered in the information change table T25, this correction data is extracted from the information change table T25 with priority over other tables, such as the design attribute table T21 to component cost table T24, and conditions of the core components are judged.

If the color arrangement of components of which conditions match with a plurality of color arrangement range conditions are specified as a plurality of sets, components corresponding to the individual arrangement range condition is sequentially judged, and the component data of the component satisfying each condition (three-dimensional component data or two-dimensional component data) is color arranged and displayed on the screen according to each specification.

Finally when the end specification is input (YES in S1008), the component color arrangement section 153 ends the component color arrangement processing.

[Effect of Component Color Arrangement Processing]

By performing component color arrangement processing using the above mentioned component color arrangement section 153 of the federation control section 150, the following effects are implemented.

When a component is confirmed by the three-dimensional and two-dimensional component images according to purpose and application, the user can specify the target component using classification and component specific information, and also can specify the color arrangement of this component, so the confirmation operation of this component by the three-dimensional and two-dimensional component images can be performed very easily by displaying the three-dimensional and two-dimensional component images of this component freely with color arrangement which the user can easily recognize visually.

Also the user can specify not only the classification and component specific information, but also can specify such color arrangement range conditions as the numeric limit and periodic limit related to the component attribute, so only the component according to the purpose and application can be color arranged and displayed. Particularly the target component can be specified not only by the conventional component attribute data, but also by the component attribute data changed by the user, so only the components matching the purpose and application of the user can be color arranged and displayed, and confirmation operation by three-dimensional and two-dimensional component images can be more effectively performed without wastefully confirming components not matching the purpose and application.

Also the user can not only specify a single condition according to the purpose and application, and specify the color arrangement of the component matching this condition, but also can specify many conditions and specify the color arrangement of components satisfying each condition respectively, so the display in a multi-color arrangement, such as the display of contour distribution, can be performed efficiently. By displaying various three-dimensional or two-dimensional component images using the component color arrangement flexibly, the user can perform various confirmation operations according to diversified purposes and applications efficiently.

[Examples of Data Federation Processing]

Examples of the data federation processing based on the data federation system according to the present embodiment will now be described using specification screen display examples. In the following examples, it is assumed that the component characteristic information of the component is "name" only to simplify description.

[Screen Display Example for Jump Processing]

Figure 11:
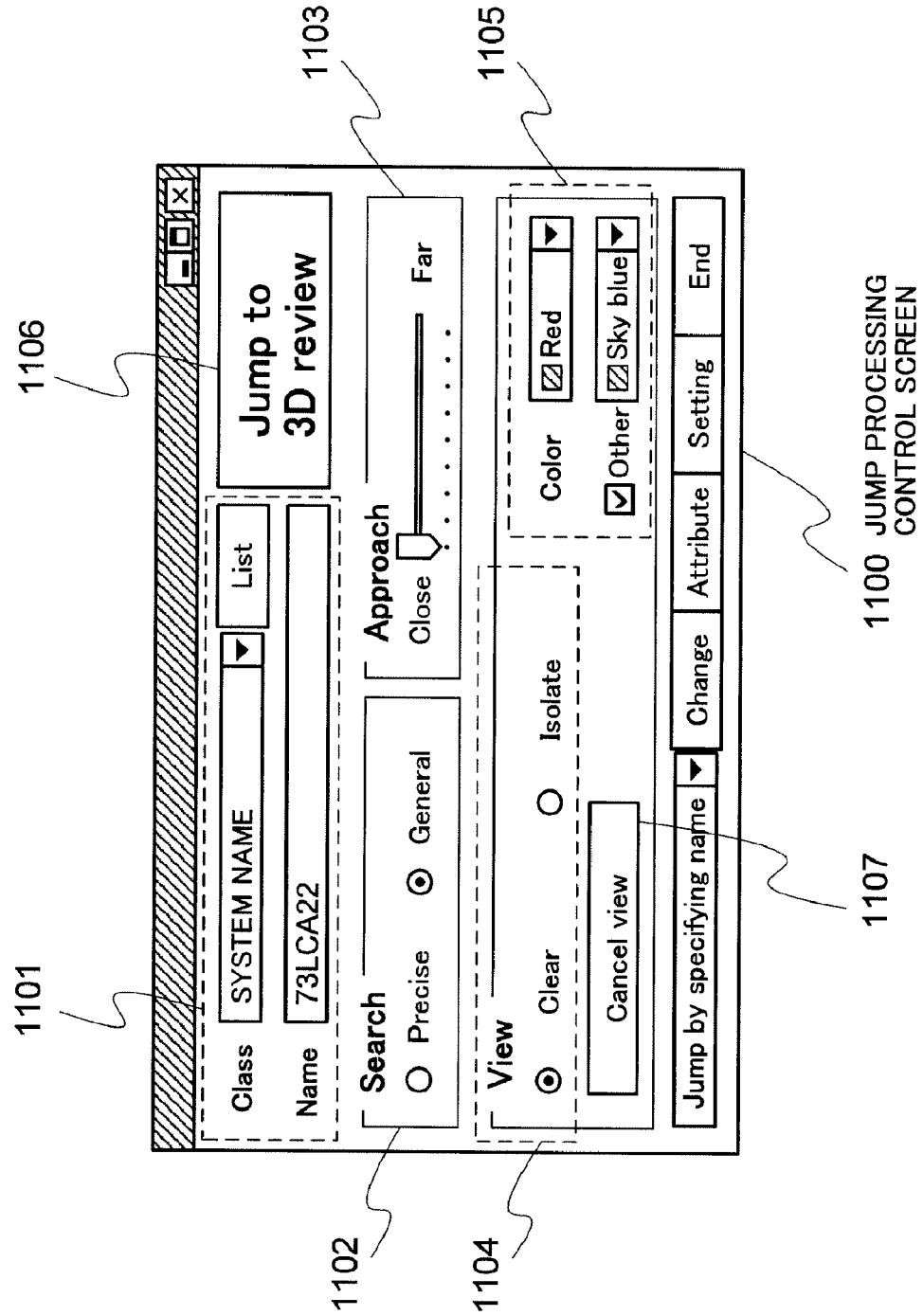
FIG. 11 shows a specific screen display example of the control screen for jump processing which is displayed by the jump section in FIG. 1.

FIG. 11 shows a specific screen display example of the control screen 1100 for jump processing, which is displayed by the jump section 151 in FIG. 1. This control screen 1100 corresponds to the control screen 400 shown in FIG. 4.

In FIG. 11, the classification and component specific information select/display field 1101 is placed at the upper left of the jump processing control screen 1100, and at the left and right there under, and the specification method select/display field 1102 and basic display method select/display field 1103 are placed respectively, and at the left and right under the specification method select/display field 1102, the highlight display method select/display field 1104 and color arrangement select/display field 1105 are placed respectively. These select/display fields 1101 to 1105 correspond to each select/display field 401 to 405 having the same lower 2 digits in the reference number shown in FIG. 4.

At the upper right of the jump processing control screen 1100, the jump execution button 1106 is placed, and under the highlight display method select/display field 1104, the highlight display cancellation button 1107 is placed. These buttons 1106 and 1107 correspond to each button 406 and 407 having the same lower 2 digits in the respective reference number shown in FIG. 4.

The configurations and functions of each select/display field 1101 to 1105 and each button 1106 and 1107 are as follows.

The classification and component specific information select/display field 1101 is comprised of a field to select "classification", field to select "name" and "list" button. In the field to select "classification", such menu contents as system name (pipeline number), pipe module number, pipe spool number, pipe arrangement product number, pipe support number, instrumentation number, equipment number and measuring instrument number is displayed as a pull down menu, so that one choice in the menu can be selected. And "name" can be selected for "classification" selected like this from the pull down menu.

In the specification method select/display field 1102, "precise" or "general" is selected as a specification method for "name". If "precise" is selected, the "list" button of the classification and component specific information select/display field 1101 can be pressed, where if the "list" button is pressed, the list of "names" stored as selected "classification" can be acquired from the classification and component specific information table T1 of the user database 141, and is displayed as a pull down menu in the "name" field so that selection is possible. If "general" is selected, on the other hand, in the specification method select/display field 1102, the character string included in "name" can be input via keyboard.

The component to be a jump destination by being selected in the classification and component specific information select/display field 1101 and the specification method select/display field 1102 are referred to as "target component" herein below.

In the basic display method select/display field 1103, a slider to set "approach" to the target component at the jump destination to an arbitrary level in advance before executing jump is provided. For example, the screen to display the target component at magnification 1, which is "close", and the screen to display at magnification 1/10, which is "far", can be selected by the operation of this slider.

In the highlight display method select/display field 1104, either "clear" or "isolate" can be set in advance as the "view" of the target component at the jump destination before executing jump. If "clear" is selected, only color arrangement is changed without changing the display and non-display of the component. If "isolate" is selected, not only color arrangement but also display and non-display are changed. In other words, only the target component is displayed, and the rest is not displayed.

In the color arrangement select/display field 1105, the color arrangement of the target component at the jump destination can be set in advance before executing jump. In the pull down menu of "color", a desirable color is selected for the target component. If the desired color is selected in the pull down menu by attaching a check in "other", the rest of the target component is completely displayed with the color arrangement selected in "other". Therefore by appropriately selecting the color arrangement between the target component and other components, the target component can be effectively highlighted using the color difference, and the user can easily confirm the target component.

For the jump execution button 1106, the "jump to 3D review" button is provided. If this jump execution button 1106 is pressed after setting in each select/display field 1101 to 1105, the target component is retrieved on the three-dimensional component database 121, and jump is executed. Although this is not shown in FIG. 11, such a button as "jump to 2D—CAD" can be created to jump to the two-dimensional component data display section 130.

For the function to retrieve the target component on the three-dimensional component database 121 and two-dimensional component database 131, the retrieve function for the three-dimensional component data display section 120 or two-dimensional component data display section 130 is directly used. For the components created by CAD, such as a three-dimensional component and two-dimensional component, character information such as "classification" and "name" can be held as an attribute, so the three-dimensional component data display section 120 or two-dimensional component data display section 130 can specify the component using the attributes "classification" and "name" by an original API instruction means.

On the other hand, in the present embodiment, the user database construction section 142 extracts data of "classification" and "name" from the three-dimensional component database 121 or two-dimensional component database 131, and holds this data as the classification and component specific information table T1 in the user database 141, so by using this classification and component specific information table T1, the federation control section 150 can control the component data in the three-dimensional component database 121 and two-dimensional component database 131.

When the component data retrieved as the target component at the jump destination, the target component is visually highlighted and differentiated from the other components by a highlight display method and color arrangement, which are set by the highlight display method select/display field 1104 and color arrangement select/display field 1105. If the highlight display cancellation button 1107 is pressed, the setting of the highlight display type and color arrangement by the highlight display method select/display field 1104 and color arrangement select/display field 1105 is cancelled.

FIG. 12 shows screen display examples of the jump destination which are displayed as the jump execution result by the jump section 151, where 1201 is a 3D review displayed by the three-dimensional component data display section 120 and 1202 is a 2D screen displayed by the two-dimensional component data display section 130.

Also on such jump destination screens, the highlight display method and color arrangement can be changed, and an arbitrary location can be specified using a graphic, such as double circles or a symbol. Therefore in the screen display at the jump destination, the user can freely change the highlight display method and color arrangement so that the user can easily visually recognize it on the screen, when the target component cannot be recognized sufficiently in the original setting of the highlight display method and color arrangement, therefore the confirmation operation of the three-dimensional or two-dimensional component images can be performed more efficiently.

[Screen Display Example for Attribute Access Processing]

Figure 13:
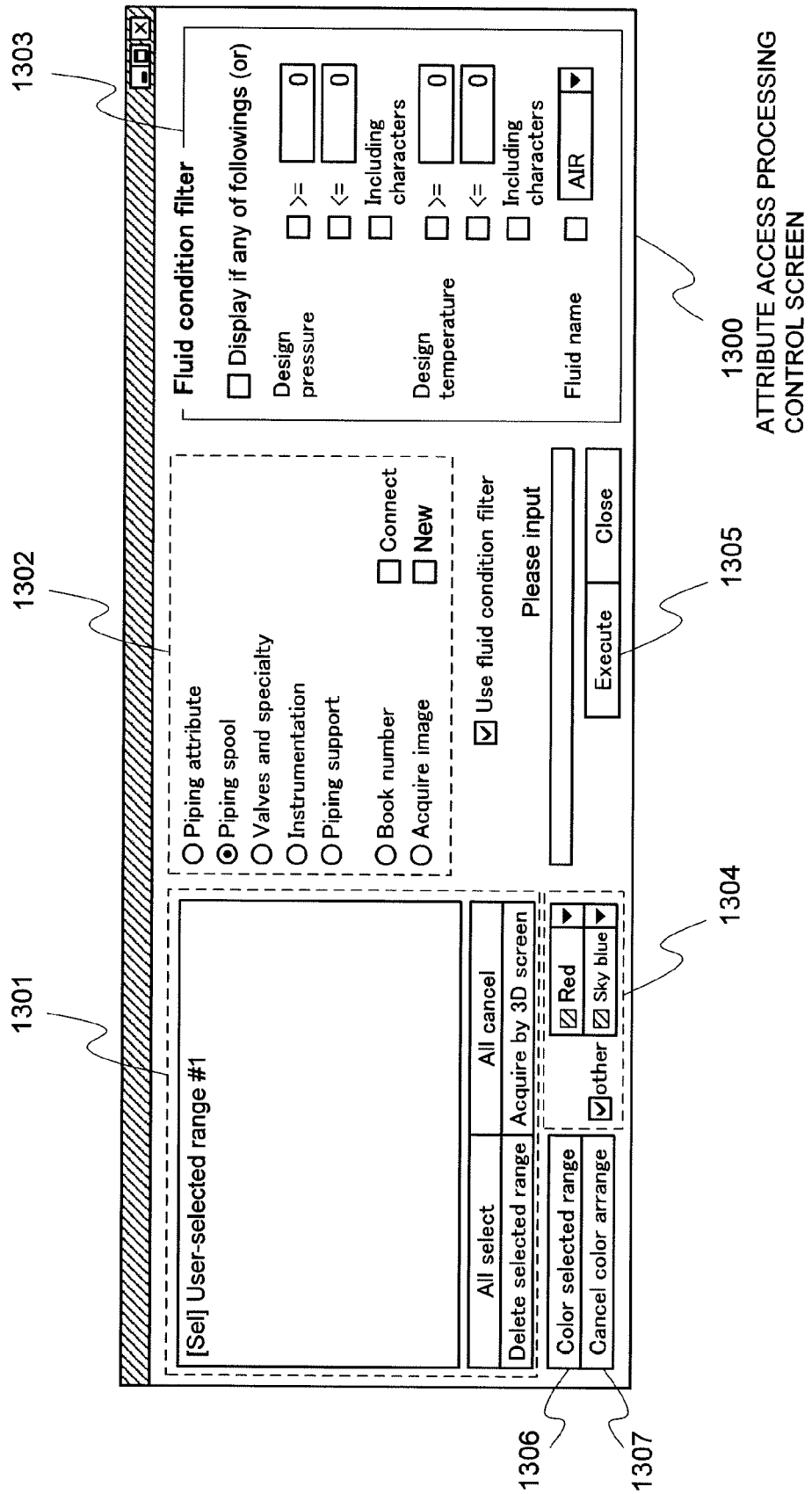
FIG. 13 shows a specific screen display example of the control screen for attribute access processing which is displayed by the attribute access section in FIG. 1.

FIG. 13 shows a specific screen display example of the control screen 130 for attribute access processing, which is displayed by the attribute access section 152 in FIG. 1. This control screen 1300 corresponds to the control screen 700 shown in FIG. 7.

In FIG. 13, an access range select/display field 1301 is placed at the left of the attribute access processing control screen 1300, and at the right of the access range select/display field 1301, the classification select/display field 1302 and component attribute condition select/display field 1303 are sequentially placed. Under the access range select/display field 1301, the color arrangement select/display field 1304 is placed. These select/display fields 1301 to 1304 correspond to each select/display field 701 to 704 having the same lower 2 digits in the reference number shown in FIG. 7 respectively.

In the attribute access processing control screen 1300, an attribute access execution button 1305 is placed under the classification select/display field 1302, and at the left of the color arrangement select/display field 1304 under the access range select/display field 1301, an access range image confirmation button 1306 and a color arrangement removal button 1307 are placed respectively. These buttons 1305 to 1307 correspond to each button 705 to 707 having the same lower 2 digits in the reference number shown in FIG. 7 respectively.

The configuration and function of each select/display field 1301 to 1304 and each button 1305 to 1307 are as follows.

The access range select/display field 1301 not only selects the access range data registered in the access range data table T3, but also is provided as a list box for registering the access range data. In other words, the user can register the data on the access range selected on the three-dimensional or two-dimensional image data screen display by the three-dimensional component data display section 120 or two-dimensional component data display section 130 into the access range data table T3 as the access range data with assigning a registration name to this list box.

After registration, an attribute can be accessed by selecting a registration name displayed in the list box. In the list box, a plurality of access range data can be registered, and when an attribute is accessed, a single or a plurality of access range data can be freely selected and used out of all the registered access range data. If the access range data is no longer necessary after registration, the registration names of unnecessary access range data are deleted from the list box, then this access range data can be deleted from the access range data table T3.

When the access range data is registered, a specific registration method based on the above mentioned user specified range registration method is, for example, setting a range by dragging the mouse on the three-dimensional or two-dimensional image display screen, and registering all the components included in the range. As a specific operation, this user specified range registration method is used as a basic setting method for the access data, and the above mentioned jump range registration method is used as the optional setting method, for example. By using both of these registration methods, all information used for specifying the components in the system can be saved in the access range data table T3 directly and indirectly.

The classification select/display field 1302 selects the classification of the component attribute data in the access range selected in the access range select/display field 1301 as the optional information. In other words, the classification of the component attribute data and the purpose of use can be selected as an option.

For the purpose of attribute access, the creation of an attribute table using a spreadsheet, for example, can be selected. In the classification select/display field 1302 in FIG. 13, the creation of an attribute table on such a classification as the piping attribute, piping spool to indicate the unit of manufacturing, valves and specialty components, instrumentation and piping support can be set.

It may be set such that an attribute is accessed by an equipment name and electric board name, for example. Another example of purpose, other than the creation of an attribute table, is an accessing application using attributes. For example, a book number is stored as component attribute data, and an application linked with an external document management system is used via the book number. An application which stores the access range selected by the access range select/display field 1301 directly as a screen image may be used. By providing such options in the classification select/display field 1302, various attributes can be accessed.

The component attribute condition select/display field 1303 is constructed as a fluid condition filter for specifying the fluid conditions of the component attribute data, where numerics such as design pressure and design temperature can be limited, or a fluid name can be selected. When the component attribute data is collected from the user database 141, the range of the component attribute data to be accessed is numerically limited or a name is selected, so that it can be judged whether these conditions are met, and the retrieval of unnecessary data can be avoided, therefore retrieval efficiency can be improved. This is particularly effective in the case when a large volume of data is handled.

This fluid condition filter can be set to be displayed or not displayed by an option, so that this function can be used according to necessity. This fluid condition filter is merely an example, and various filters using name matching, numeric limit and periodic limit can be used according to necessity.

In the color arrangement select/display field 1304, the color arrangement of the components in the access range is set in advance for image confirmation of the access range. The configurations and functions of the color arrangement select/display field 1304 are the same as those of the color arrangement select/display field 1105 in the control screen 1100 for jump processing shown in FIG. 11. If the color arrangement cancellation button 1307 is pressed, the color arrangement setting by the color arrangement select/display field 1304 is cancelled.

If the access range image confirmation button 1306 is pressed after color arrangement is set in the color arrangement select/display field 1304, the attribute access section 152 displays the three-dimensional or two-dimensional image display screen in the access range defined by selection in the access range select/display field 1301, classification select/display field 1302 and component attribute condition select/display field 1303, and highlight displays this component with the color arrangement being set, so that this range can be confirmed as an image.

If the attribute access execution button 1305 is pressed after setting in each select/display field 1301 to 1304, attribute access execution processing is performed using the classification and purpose which were set in the classification select/display field 1302 and fluid condition filter by the component attribute condition select/display field 1303 for the access range selected by the access range select/display field 1301. In other words, by controlling the three-dimensional component data display section 120 or two-dimensional component data display section 130, "classification" and "name" are extracted from the three-dimensional component database 121 or two-dimensional component database 131 as the component attribute in this access range.

If pipe spool is selected in the classification select/display field 1302, for example, only components of which classification is pipe spool are retrieved. If one component is detected, components having the pipe spool name are immediately removed from the retrieval target so as to increase the retrieval speed. The extracted "classification" and "name" are temporarily stored in the operation area of the storage section 154 as the attribute access target component list. The attribute access section 152 links with the component attribute data table T2 like this via the classification and component specific information table T1 of the user database 141 by the attribute access target component list of "classification" and "name" which are temporarily stored.

In this attribute access processing, too much attribute information should not be used when the three-dimensional component database 121 or two-dimensional component database 131 is retrieved by the three-dimensional component data display section 120 or two-dimensional component data display section 130. Because if too much information is used for retrieval in the three-dimensional component data display section 120 and two-dimensional component data display section 130, which perform interactive processing, processing efficiency is decreased.

In the present embodiment, a link with another component attribute data is possible only by using "classification" and "name" of the component or other component specific information, without using too much attribute information to link the three-dimensional component data display section 120 or two-dimensional component data display section 130, so a large volume of component attribute data can be virtually used without dropping the processing frequency.

In this way, after linking with the component attribute data table T2 via the classification and component specific information table T1 of the user database 141 by the extracted "classification" and "name", an attribute table spreadsheet can be created using this "classification" and "name" as keys. If a book number can be acquired from an attribute, the book file with this book number can be obtained by sending the book number to the document management system via an application. Also various attributes can be accessed using "classification" and "name".

FIG. 14 shows screen display examples which are displayed as a result of this attribute access result, where 1401 shows the attribute table and 1402 shows the book number input screen for accessing an external document management system.

[Screen Display Example for Component Color Arrangement Processing on Fluid Conditions]

Figure 15:
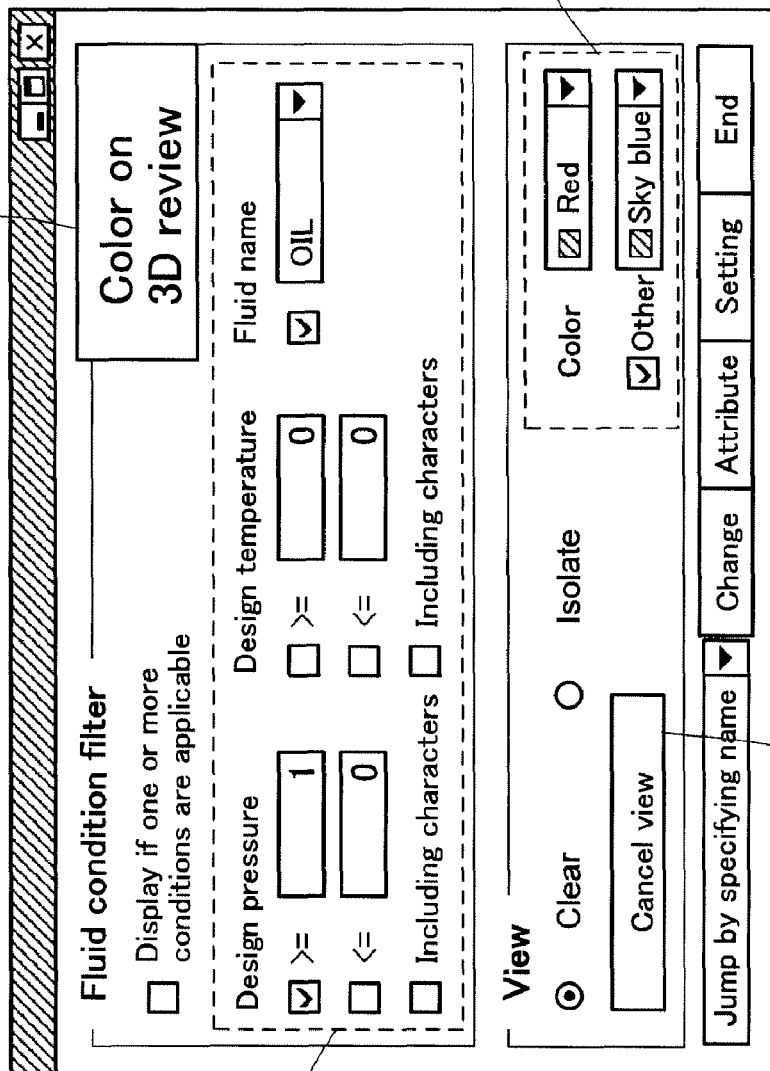
FIG. 15 shows a specific screen display example of the control screen for component color arrangement processing on fluid conditions, as the control screen for component color arrangement processing which is displayed by the component color arrangement section in FIG. 1.

FIG. 15 shows a control screen for component color arrangement processing which is displayed by the component color arrangement section 153 in FIG. 1, and particularly shows a specific screen display example of the control screen 1500 for component color arrangement processing on fluid conditions. This control screen 1500 corresponds to the control screen 900 in FIG. 9.

In FIG. 15, a color arrangement range condition select/display field 1501 is placed at the center of the component color arrangement processing control screen 1500 on fluid conditions, and at the lower right of the color arrangement range condition select/display field 1501, the color arrangement select/display field 1502 is placed. These select/display fields 1501 and 1502 correspond to each select/display fields 901 and 902, having the same lower 2 digits in the reference number in FIG. 9 respectively.

In the component color arrangement processing control screen 1500 on fluid conditions, the component color arrangement execution button 1505 is placed at the upper right of the color arrangement range condition select/display field 1501, and at the lower left of the color arrangement range condition select/display field 1501, the color arrangement cancellation button 1506 is placed. These buttons 1505 and 1506 correspond to each button 905 and 906 having the same lower 2 digits in the reference number in FIG. 9 respectively.

The configurations and functions of each select/display field 1501 and 1502 and each button 1505 and 1506 are as follows.

In the color arrangement range condition select/display field 1501, fluid conditions can be input as a color arrangement range condition. Here the design pressure, design temperature and fluid name are provided as the input items. The function of an item in the fluid condition filter is activated by attaching a check. The design pressure and design temperature can be input by a numeric range if numerics are used. It is possible that the design pressure and design temperature are not specified by numerics. For example, if the design pressure is an atmospheric pressure, then "ATM" may be indicated instead of numerics. Therefore a check is attached to "including characters" so that it can be judged and controlled whether the setting is not simply numerics but includes characters.

In the color arrangement select/display field 1502, the color arrangement of components in the color arrangement range is set in advance. The configuration and function of this color arrangement select/display field 1502 is the same as the color arrangement select/display field 1105 in the jump processing control screen 1100 shown in FIG. 11, and the color arrangement select/display field 1304 in the attribute access processing control screen 1300 shown in FIG. 13. The function of the color arrangement cancellation button 1506 is the same as the color arrangement cancellation button 1307 in the attribute access processing control screen 1300 shown in FIG. 13, and if the color arrangement cancellation button 1506 is pressed, the setting of color arrangement by the color arrangement select/display field 1502 is cancelled.

If the component color arrangement execution button 1505 is pressed after setting in each select/display field 1501 and 1502, the component color arrangement section 153 displays the three-dimensional or two-dimensional display screen of the component in the color arrangement range defined by the selection of the color arrangement range condition select/display field 1501 and highlight displays the component with the color arrangement being set, just like the case of the access range image confirmation processing in the attribute access section 152.

In this case, "classification" and "name" in the component attributes of the three-dimensional component database 121 and two-dimensional component database 131 are linked with the other table group constituting the component attribute data table T2 via the classification and component specific information table T1 in the user database 141, so a component in the three-dimensional component database 121 or two-dimensional component database 131 can be easily specified from the design attribute table T21 in this component attribute data table T2.

For example, in the color arrangement range select/display field 1501, if the classification is "pipe" and the attribute is "design pressure 0.5 MPa" under conditions, the component color arrangement section 153 acquires the system name corresponding to the color arrangement range, and retrieves a component having this system name as an attribute in the three-dimensional component database 121 or two-dimensional component database 131. If the component is specified by retrieval, the color arrangement is changed to that set by the color arrangement select/display field 1502, and the component is displayed with the color arrangement. By differentiating the component on arbitrary fluid conditions by changing the color arrangement on the image display screen of the three-dimensional and two-dimensional component data, the load on the visual confirmation operation of the user on fluid conditions can be decreased.

[Screen Display Example for Component Color Arrangement Processing on Component Delivery Time]

FIG. 16 shows a control screen for component color arrangement processing which is displayed by the component color arrangement section 153 in FIG. 1, and particularly shows a specific screen display example of the component color arrangement processing control screen 1600 on component delivery time. This control screen 1600 corresponds to the control screen 900 shown in FIG. 9.

In FIG. 16, at the left of the component color arrangement processing control screen 1600 on component delivery time, the color arrangement range condition and color arrangement set select/display field 1603 is placed, and at the lower right of the color arrangement range condition and color arrangement set select/display field 1603, the color arrangement execution range select/display field 1604 is placed. These select/display fields 1603 and 1604 correspond to each select/display field 903 and 904 having the same lower 2 digits in the reference numbers shown in FIG. 9 respectively.

In the component color arrangement processing control screen 1600 on component delivery time, the component color arrangement execution button 1605 and color arrangement cancellation button 1606 are vertically placed at the upper right of the color arrangement condition and color arrangement set select/display field 1603, and the information change content registration button 1607 is placed there between. These buttons 1605-1607 correspond to each button 905 to 907 having the same lower 2 digits in the reference numbers shown in FIG. 9 respectively.

The configurations and functions of each select/display field 1603 and 1604 and each button 1605 to 1607 are as follows.

In the color arrangement range condition and color arrangement set select/display field 1603, the pull down menus of a plurality of events on component delivery time for checking whether each event is executed and for color arrangement change are provided respectively. Whether the component is the color arrangement target or not is controlled by a check attached to the event. The color arrangement of a checked event is selected from the pull down menu. The date of setting is determined by the "color in state of this day" field.

In the color arrangement execution range select/display field 1604, one of "color range", "only selected range" and "all" can be selected. In other words, in the case of the three-dimensional component database 121 or two-dimensional component database 131, many component data is stored, and it may take considerable time if the color range is "all". In other words, it is unnecessary to perform coloring for "all" ranges, and the purpose may be achieved merely by coloring only in a selected range. On the other hand, in the color arrangement execution range select/display field 1604, the user can freely select "color range" according to the situation.

If the information change content registration button 1607 is pressed, the component color arrangement section 153 controls the user data display section 140, and executes "latest data read" of the component attribute data changed by the user. In other words, the component attribute data changed by the user is stored in the information change table T25 shown in FIG. 2 in the component attribute data table T2 as the latest data.

The reason why the information change content of the component attribute data stored in a table is different from conventional component attribute data follows. When the data federation system 100 according to the present embodiment is operated, the user database 141 may be provided to the user in terms of batch management, but in this case, the user may already have a component attribute data which is different from the component attribute data in the user database 141. In this case, the data owned by the user can be loaded into the user database via a spreadsheet, for example. However this data must be separated from the provided data in terms of batch management, the data is stored in the information change table T25 in the user database 141, for example, according to the present embodiment.

If the component color arrangement execution button 1605 is pressed after setting in each select/display field 1603 and 1604, the component color arrangement section 153 displays the three-dimensional or two-dimensional image display screen of each component corresponding to each condition defined by the selection in the color arrangement range condition and color arrangement set select/display field 1603, just like the case of the access range image confirmation processing in the attribute access section 152, and each component is highlight displayed by each color arrangement. In this case, the state of a date which is before the data being set in "color in state of this date" and closest to now is selected as the color arrangement target. Therefore the event completed in terms of component delivery time can be differentiated by color arrangement on the three-dimensional or two-dimensional image display screen at the point of the date which is set, so the load on the visual confirmation operation by the user on component delivery time can be decreased.

As mentioned above, "classification" and "name" in the component attributes in the three-dimensional component database 121 or two-dimensional component database 131 are linked to the other table groups constituting the component attribute data table T2 via the classification and component specific table T1 in the user database 141, so a component in the three-dimensional component database 121 or two-dimensional component database 131 can be easily specified from the component delivery table T23 in the component attribute data table T2.

Here if "latest data read" is being executed by the information change content registration button 1607, "classification" and "name" in the component attribute of the three-dimensional component database 121 or two-dimensional component database 131 are also linked with the information change table T25, and if "classification" and "name" are the same as the component delivery time table T23, the information change table T25 has priority. Using the setting of component delivery time and color arrangement and these table links, "classification" and "name" of the color arrangement target component are acquired, and the component having this system name as an attribute is retrieved on the three-dimensional component database 121 and two-dimensional component database 131. If the component is specified by retrieval, color arrangement is change to that specified in the color arrangement range condition and color arrangement set select/display field 1603, and the data is displayed.

Other Embodiments

The present invention is not limited to the above embodiments, but various modifications are possible within the scope of the present invention. The system configuration and flow chart shown in the drawings are just examples, and details on a specific functional configuration, screen configuration and details on operation can be appropriately selected.

In the above embodiment, the case of implementing a method of the present invention by hardware and programs of a computer were described, but the method of the present invention can also be implemented only by computer programs customized for data federation.

In other words, embodiments can be freely selected in the present invention, as long as classification or component specific information to indicate a specific component is acquired from the user using the user data display means for managing a table on classification and component specific information and a table on other component attribute data, and three-dimensional component data or two-dimensional component data of this component is retrieved and the component is displayed on the screen.

This application claims priority from Japanese Patent Application No. 2006-219244, filed Aug. 11, 2006, all of which is incorporated herein by reference in its entirety.

What is claimed is:

1. A data federation system for implementing data federation among a plurality of data display means having mutually independent databases respectively by using a computer, comprising:

interface means for inputting various instruction and data and performing screen display;

three-dimensional component data display means comprising a three-dimensional component database storing three-dimensional component data including classification of each component and component specific information, for displaying the three-dimensional component data on a screen by said interface means;

two-dimensional component data display means comprising a two-dimensional component database storing two-dimensional component data including classification of each component and component specific information, for displaying the two-dimensional component data on a screen by said interface means;

user data display means comprising a table on classification and component specific information extracted from said three dimensional component database and said two-dimensional component database respectively, and a user database including a table on component attribute data associated thereto, for displaying the component attribute data on a screen by said interface means; and federation control means for controlling said three-dimensional component data display means, said two-dimensional component data display means and said user data display means, wherein said federation control means comprises:

jump means which acquires classification or component specific information to indicate a specific component based on an instruction provided by a user via said interface means by using said table on the classification and component specific information, retrieves said three-dimensional component database or said two-dimensional component database for said specific component based on the acquired information, and displays the retrieved three-dimensional component data or two-dimensional component data on said specific component on a screen by said interface means; and attribute access means which registers access range data used for specifying a range of said component attribute data acquired from the table of said component attribute data, specifies an attribute access range based on an instruction provided by the user via said interface means using the registered access range data, extracts the component attribute data in said specified attribute access range from the table of said component attribute data, and displays said extracted component attribute data or related data acquired using the component attribute data on a screen by said interface means, wherein said attribute access means, as a registration method for registering said access range data, employs at least one of the following two types of registration methods:

a jump range registration method which registers classification or component specific information in a case when said classification or component specific information is acquired to indicate a specific component based on an instruction from said user and the three-dimensional component data or two-dimensional component data is displayed on a screen by said jump means; and a user specified range registration method which registers a user specified range information to indicate a range, specified based on an instruction from said user, when a three-dimensional component data or two-dimensional component data is displayed on a screen by said interface means.

2. The data federation system according to claim 1, wherein said jump means is constructed such that when classification or component specific information to indicate a specific component is acquired from the user via said interface means by using said classification and component specific information table, display conditions on said component are acquired, and when the retrieved three-dimensional component data or two-dimensional component data on said component is displayed on a screen by said interface means, the data is displayed based on said display conditions.

3. The data federation system according to claim 2, wherein said display conditions include a highlight display method including a degree of distance and color arrangement of a component.

4. The data federation system according to claim 1, wherein when an attribute access range is specified based on an instruction from the user via said interface means by using said registered access range data, said attribute access means specifies limit conditions in said range, and extracts only component attribute data satisfying said limit conditions.

5. The data federation system according to claim 4, wherein said limit conditions include conditions selected from classification of the component, component specific information, and numeric limit and periodic limit related to the component attribute.

6. The data federation system according to claim 1, wherein said attribute access means, as said extracted component attribute data or a related data acquired using this data, is constructed such that at least one of an attribute table created using said component attribute data and data acquired as a response from another means after said component attribute data is sent to said other means which either has a database, or performs data processing is displayed on a screen by said interface means.

7. The data federation system according to claim 1, wherein said federation control means comprises component color arrangement means for specifying a color arrangement range and color arrangement based on the instruction from said user for component data in said three-dimensional component database or said two-dimensional component database, extracting component data in said color arrangement range specified from said three-dimensional component database or said two-dimensional component database, and displaying said extracted component data on a screen by said interface means in use of the specified color arrangement.

8. The data federation system according to claim 7, wherein said component color arrangement means is constructed such that when color arrangement range and color arrangement are specified based on the instruction from said user for component data in said three-dimensional component database or said two-dimensional component database, display conditions related to said color arrangement are specified, and when the component data in said specified color arrangement range is displayed on a screen by said interface means in use of said specified color arrangement, the component data is displayed based on said display conditions.

9. The data federation system according to claim 7, wherein said component color arrangement means is constructed such that when a color arrangement range and color arrangement are specified based on the instruction from said user for the component data in said three-dimensional component database or said two-dimensional component database, limit conditions of the component attribute in the component in said color arrangement range are specified by using the table of said component attribute data, and only the component data corresponding to the component attribute data specified as said limit conditions is extracted as the color arrangement target.

10. A control method for a data federation system for implementing data federation among a plurality of data display means having mutually independent databases respectively by using a computer, wherein said data federation system comprises:

interface means for inputting various instructions and data, and performing screen display;

three-dimensional component data display means comprising a three-dimensional component database storing three-dimensional component data including classification of each component and component specific information, for displaying the three-dimensional component data on a screen by said interface means;

two-dimensional component data display means comprising a two-dimensional component database storing two-dimensional component data including classification of each component and component specific information, for displaying the two-dimensional component data on a screen by said interface means; and user data display means comprising a table on classification and component specific information extracted from said three-dimensional component database and said two-dimensional component database respectively, and a user database including a table on component attribute data associated thereto, for displaying the component attribute data on a screen by said interface means, wherein a federation control processing is performed for controlling data federation among said three-dimensional component data display means, said two-dimensional component data display means and said user data display means, wherein said federation control processing comprises:

a jump processing which acquires classification or component specific information to indicate a specific component based on an instruction provided by a user via said interface means by using said table on classification and component specific information, retrieves said three dimensional component database or said two-dimensional component database for said specific component based on the acquired information, and displays the retrieved three-dimensional component data or two-dimensional component data on said specific component on a screen by said interface means; and an attribute access processing which registers access range data used for specifying a range of said component attribute data acquired from the table of said component attribute data, specifies an attribute access range based on an instruction provided by the user via said interface means using the registered access range data, extracts the component attribute data in said specified attribute access range from the table of said component attribute data, and displays said extracted component attribute data or related data acquired using the component attribute data on a screen by said interface means, wherein said attribute access processing, as a registration method for registering said access range data, employs at least one of the following two types of registration methods:

a jump range registration method which registers classification or component specific information in a case when said classification or component specific information is acquired to indicate a specific component based on an instruction from said user and the three-dimensional component data or two-dimensional component data is displayed on a screen by said jump processing; and a user specified range registration method which registers a user specified range information to indicate a range, specified based on an instruction from said user, when a three-dimensional component data or two-dimensional component data is displayed on a screen by said interface means.

11. The control method according to claim 10, wherein said jump processing is performed such that when classification or component specific information to indicate a specific component is acquired from the user via said interface means by using said classification and component specific information table, display conditions on said component are acquired, and when the retrieved three-dimensional component data or two-dimensional component data on said component is displayed on a screen by said interface means, the data is displayed based on said display conditions.

12. The control method according to claim 11, wherein said display conditions include a highlight display method including a degree of distance and color arrangement of a component.

13. The control method according to claim 10, wherein when an attribute access range is specified based on an instruction from the user via said interface means by using said registered access range data, said attribute access processing specifies limit conditions in said range, and extracts only component attribute data satisfying said limit conditions.

14. The control method according to claim 13, wherein said limit conditions include conditions selected from classification of the component, component specific information, and numeric limit and periodic limit related to the component attribute.

15. The control method according to claim 10, wherein said attribute access processing is constructed such that at least one of an attribute table created using said component attribute data and data acquired as a response from another means after said component attribute data is sent to said other means which either has a database, or performs data processing is displayed on a screen by said interface means.

16. The control method according to claim 10, wherein said federation control processing comprises component color arrangement processing for specifying a color arrangement range and color arrangement based on the instruction from said user for component data in said three-dimensional component database or said two-dimensional component database, extracting component data in said color arrangement range specified from said three-dimensional component database or said two-dimensional component database, and displaying said extracted component data on a screen by said interface means in use of the specified color arrangement.

17. The control method according to claim 16, wherein said component color arrangement processing is performed such that when color arrangement range and color arrangement are specified based on the instruction from said user for component data in said three-dimensional component database or said two-dimensional component database, display conditions related to said color arrangement are specified, and when the component data in said specified color arrangement range is displayed on a screen by said interface means in use of said specified color arrangement, the component data is displayed based on said display conditions.

18. The control method according to claim 16, wherein said component color arrangement processing is performed such that when a color arrangement range and color arrangement are specified based on the instruction from said user for the component data in said three-dimensional component database or said two-dimensional component database, limit conditions of the component attribute in the component in said color arrangement range are specified by using the table of said component attribute data, and only the component data corresponding to the component attribute data specified as said limit conditions is extracted as the color arrangement target.

19. A non-transitory computer-readable medium storing a control program for a data federation system for implementing data federation among a plurality of data display means having mutually independent databases respectively by using a computer, wherein when said data federation system comprises:

interface means for inputting various instructions and data, and performing screen display;

three-dimensional component data display means comprising a three-dimensional component database storing three-dimensional component data including classification of each component and component specific information, for displaying the three-dimensional component data on a screen by said interface means;

two-dimensional component data display means comprising a two-dimensional component database storing two-dimensional component data including classification of each component and component specific information, for displaying the two-dimensional component data on a screen by said interface means;

and user data display means comprising a table on classification and component specific information extracted from said three-dimensional component database and said two-dimensional component database respectively, and a user database including a table on component attribute data associated thereto, for displaying the component attribute data on a screen by said interface means, the program causing the computer to perform a federation control processing as—a federation control function for controlling data federation among said three-dimensional component data display means, said two-dimensional component data display means and said user data display means, wherein said federation control processing comprises:

a jump processing which acquires function is executed by said computer for acquiring classification or component specific information to indicate a specific component based on an instruction provided by a user via said interface means, by using said table on classification and component specific information, retrieves retrieving said three-dimensional component database or said two-dimensional component database for said specific component based on the acquired information, and displays displaying the retrieved three-dimensional component data or two-dimensional component data on a screen by said interface means; and an attribute access processing which registers access range data used for specifying a range of said component attribute data acquired from the table of said component attribute data, specifies an attribute access range based on an instruction provided by the user via said interface means using the registered access range data, extracts the component attribute data in said specified attribute access range from the table of said component attribute data, and displays said extracted component attribute data or related data acquired using the component attribute data on a screen by said interface means, wherein said attribute access processing, as a registration method for registering said access range data, employs at least one of the following two types of registration methods:

a jump range registration method which registers classification or component specific information in a case when said classification or component specific information is acquired to indicate a specific component based on an instruction from said user and the three-dimensional component data or two-dimensional component data is displayed on a screen by said jump processing; and a user specified range registration method which registers a user specified range information to indicate a range, specified based on an instruction from said user, when a three-dimensional component data or two-dimensional component data is displayed on a screen by said interface means.

* * * * *